United States Patent
Stothers et al.

(10) Patent No.: US 9,803,999 B2
(45) Date of Patent: Oct. 31, 2017

(54) PROXIMITY SENSOR MONITOR

(71) Applicant: Ultra Electronics Limited, Greenford, Middlesex (GB)

(72) Inventors: Ian McGregor Stothers, Saham Toney (GB); Ivan Anthony Scott, Histon (GB); James Peachey, Milton (GB)

(73) Assignee: Ultra Electronics Limited, Greenford (GB)

( * ) Notice: Subject to any disclaimer, the term of this patent is extended or adjusted under 35 U.S.C. 154(b) by 181 days.

(21) Appl. No.: 14/421,501

(22) PCT Filed: Aug. 14, 2013

(86) PCT No.: PCT/GB2013/052165
§ 371 (c)(1),
(2) Date: Feb. 13, 2015

(87) PCT Pub. No.: WO2014/027200
PCT Pub. Date: Feb. 20, 2014

(65) Prior Publication Data
US 2015/0185050 A1 Jul. 2, 2015

(30) Foreign Application Priority Data
Aug. 17, 2012 (GB) .................................. 1214675.9

(51) Int. Cl.
*G01D 5/24* (2006.01)
*G01D 3/08* (2006.01)
*G01D 5/20* (2006.01)
*H03K 17/95* (2006.01)
*G01B 7/00* (2006.01)
*G01B 7/14* (2006.01)
*G01R 31/28* (2006.01)

(52) U.S. Cl.
CPC ............... *G01D 5/24* (2013.01); *G01B 7/003* (2013.01); *G01B 7/14* (2013.01); *G01D 3/08* (2013.01); *G01D 5/20* (2013.01); *H03K 17/9502* (2013.01); *G01R 31/2829* (2013.01)

(58) Field of Classification Search
CPC ......... H03K 17/9502; G01D 3/08; G01D 5/20
USPC ....................................................... 324/713
See application file for complete search history.

(56) References Cited

U.S. PATENT DOCUMENTS 6,424,146 B2 7/2002 Demma et al.
6,954,062 B2 10/2005 Slates
(Continued)

FOREIGN PATENT DOCUMENTS

GB       2 439 236 A    12/2007
WO  WO 2005/085883 A2   9/2005

*Primary Examiner* — Douglas X Rodriguez
(74) *Attorney, Agent, or Firm* — Blank Rome LLP

(57) ABSTRACT

The present invention generally relates to proximity sensor monitors and proximity monitor systems incorporating proximity sensor monitors. A proximity sensor monitor measures the impedance or other electrical characteristics of a proximity sensor component to determine the presence of a target. The proximity sensor monitor performs this measurement independently of a separate proximity sensor. The proximity sensor monitor is configured to compensate for differences between the measurement frequency of the proximity sensor monitor and the driving frequency of the proximity sensor.

57 Claims, 8 Drawing Sheets

(56) References Cited

U.S. PATENT DOCUMENTS 7,358,720 B1     4/2008   Maier
2002/0196025 A1*   12/2002   Freeman ................ G01R 27/02
                                                                     324/426

\* cited by examiner

Prior Art

PROXIMITY SENSOR MONITOR

FIELD OF THE INVENTION

The present invention generally relates to proximity sensor monitors to and proximity monitor systems incorporating proximity sensor monitors.

BACKGROUND OF THE INVENTION

Recent changes in safety requirements in the aerospace industry have meant that more and more systems, subsystems and pieces of equipment form part of the Functional Hazard Analysis (FHA). The FHA identifies system failures and identifies the effects of these failures. Failures are tabulated and classified according the effects which that failure may cause and the safety objectives assigned according to the criteria are shown below:

| Failure condition classification | Development assurance level | Safety objectives quantities required (probability per flight hour) |
| --- | --- | --- |
| Catastrophic | A | $<1 \times 10^{-9}$ |
| Hazard/Severe | B | $<1 \times 10^{-7}$ |
| Major | C | $<1 \times 10^{-5}$ |
| Minor | D | $<1 \times 10^{-3}$ |
| No safety effect | E | None |

In essence, failure conditions may result in a piece of equipment failing to do something, or inadvertently doing something it shouldn't. It may also comprise a failure to indicate an event or a failure to indicate that an event has not happened.

One such subsystem required to fulfil the FHA is landing gear detectors (for example proximity sensors), which are located on the fuselage or in the landing gear, and interacts with the fuselage or landing gear to determine whether or not the landing gear has been deployed or retracted. Clearly the pilot would wish to know with confidence whether or not the landing gear has been deployed when attempting to land so that he can chose the most appropriate course of action should there be a problem with the landing gear deploying.

In order to fulfil the FHA, one solution is to have two independent landing gear detectors located to determine the location of the landing gear. In the event that one detector fails, the secondary detector can still give a reliable reading. However, this is not always possible due to weight and space constraints in locating the secondary detector. In practice, these landing gear detectors are proximity sensors, which detect changes in the impedance of a component depending on the location of a target.

Since there are already proximity sensors in landing gear components performing the task of detecting the location of the landing gear, we have therefore appreciated the need for a proximity sensor monitor for monitoring the status of a proximity sensor (for example with use with landing gear), and improved proximity sensor systems incorporating the proximity sensor monitor.

SUMMARY OF THE INVENTION

The present invention therefore provides a proximity sensor monitor for sensing the proximity of a target and for coupling to a proximity sensor for sensing the proximity of the same target, the proximity sensor comprising: an electrical component having electrical properties that vary with the proximity of the target; an impedance component connected to the electrical component and having a known impedance; and a signal generator for generating an electrical signal for application to the connected electrical and impedance components, the electrical and impedance components being arranged to provide first and second analogue voltage signals in response to the electrical signal from the signal generator; the proximity sensor monitor comprising: a first and second input for receiving respectively first and second analogue voltage signals from the proximity sensor; a switch coupled to the first and second inputs and being configured to switch between the first and second inputs; an analogue-to-digital converter coupled to the switch for receiving an analogue voltage signal and for generating a digital voltage signal; and a processor connected to the analogue-to-digital converter for receiving the digital voltage signal and for generating a proximity monitor signal, wherein the processor is configured to control the switch to connect to the first and second inputs sequentially to measure the first analogue voltage signal and the second analogue voltage signal respectively, and wherein the processor is configured to compensate for a frequency difference between an excitation frequency used to generate the proximity monitor signal, and an excitation frequency used to generate an electrical signal applied to the connected electrical and impedance components by a signal generator of a proximity sensor, in order to generate the proximity monitor signal.

By providing a separate proximity sensor monitor that is coupleable to the impedance and electrical components of a proximity monitor, a separate measurement path can be provided in order to monitor the proximity of a target, thereby satisfying the Functional Hazard Analysis requirements. Since the measurement path of the proximity sensor monitor is independent of the proximity sensor, however, the excitation frequency used to generate the proximity monitor signal and the excitation frequency used to generate an electrical signal applied to the series connected electrical and impedance components by a signal generator of the proximity sensor will be different. As such, the processor is advantageously configured to compensate for this difference, which would otherwise cause the independent measurements to differ by too large a degree to give the user any confidence in the measurements.

The processor may be configured to generate the proximity monitor signal as a measure of impedance or at least one component of the impedance of the electrical component. Furthermore, the processor may be configured to generate the proximity monitor signal as an indication of whether or not a factor related to the impedance or at least one component thereof is above or below a threshold. In other words, the output of the proximity sensor and proximity sensor monitors may be a measurement or indication of an impedance value, which depends on the proximity of a target. The proximity sensor output and the proximity sensor monitor outputs may alternatively be an indication that the target is "near" (i.e. within a predetermined range of the proximity sensor) or "far" (i.e. outside of a predetermined range of the proximity sensor).

In some embodiments, the processor is configured to compensate for the frequency difference by: determining a first parameter indicative of a phase of the complex amplitude of a first measured voltage measured at a first time; determining a second parameter indicative of a phase of the complex amplitude of a second measured voltage measured at a second time; determining a third parameter indicative of a phase of the complex amplitude of a third measured voltage measured at a third time; determining a phase correction value dependant on the first and third parameters; applying the phase correction value to the first or third measured voltages in order to generate a fourth voltage, the fourth voltage representing a first or third voltage at the second time.

In such an embodiment, the first and third measured voltages may be voltages measured at the first input; and the second measured voltage may be a voltage measured at the second input. Alternatively, the first and third measured voltages may be voltages measured at the second input; and the second measured voltage may be a voltage measured at the first input. In either case, the processor is configured to determine a phase correction value by using linear or polar interpolation using the first and third parameters.

In alternative embodiments, the processor is configured to compensate for the frequency difference by: determining a first parameter indicative of a phase of the complex amplitude of a first measured voltage measured at a first time; determining a second parameter indicative of a phase of the complex amplitude of a second measured voltage measured at a second time; determining a third parameter indicative of a phase of the complex amplitude of a third measured voltage measured at a third time; determining a phase correction value dependant on the first and second parameters; applying the phase correction value to the first or second measured second voltage in order to generate a fourth voltage, the fourth voltage representing a first or second voltage at the third time.

In such alternative embodiments, the first and second measured voltages may be voltages measured at the first input; and the third measured voltage may be a voltage measured at the second input. Alternatively, the first and second measured voltages may be voltages measured at the second input; and the third measured voltage may be a voltage measured at the first input.

In such alternative embodiments, the processor is configured to determine a phase correction value by extrapolation using the first and second parameters.

In the alternative embodiment, the first and second measured voltages are measured in consecutive switching cycles. Alternatively, the first and second measured voltages are measured during first and second portions of a single switching cycle.

In a further alternative embodiment, the proximity sensor monitor may comprise a counter unit to receive an excitation signal from a proximity sensor indicative of an excitation frequency used to generate an electrical signal applied to the connected electrical and impedance components by a signal generator of a proximity sensor, and wherein the proximity sensor monitor processor is configured to determine a phase correction value from a difference in the frequency of the excitation frequency of the proximity sensor, and an excitation frequency used to generate the proximity monitor signal.

In this further alternative embodiment, the processor is configured to compensate for the frequency difference by: determining a first parameter indicative of a phase of the complex amplitude of a first measured voltage measured at a first time; determining a second parameter indicative of a phase of the complex amplitude of a second measured voltage measured at a second time; applying the phase correction value to the first measured voltage in order to generate a fourth voltage, the fourth voltage representing a first voltage at the second time.

In such further alternative embodiments, the first measured voltage may be a voltage measured at the first input; and the second measured voltage may be a voltage measured at the second input. Alternatively, the first measured voltage may be a voltage measured at the second input; and the second measured voltage may be a voltage measured at the first input.

In any of the above-mentioned embodiments, the switch may comprise two outputs and wherein the switch is configured such that when one output is connected to the first end of the impedance component corresponding to a first voltage, the other output is connected to the second end of the impedance component corresponding to a second voltage, and wherein the processor is configured to measure the first and second voltages for each of the switch outputs. Preferably, the proximity sensor monitor may comprise a multiplexor having first and second inputs coupled to respective first and second outputs of the switch, and an output coupled to the analogue-to-digital converter.

The proximity sensor monitor may also comprise a comparison unit having an input for receiving a proximity signal from a proximity sensor, and an input for receiving the proximity monitor signal, the comparison unit being configured to compare the proximity signal and proximity monitor signal to detect a fault condition in which the difference between the signals is greater than a threshold, and configured to output a warning if a fault condition is detected.

The proximity sensor monitor may also comprise a difference amplifier coupled between the first input and one input of the switch, the difference amplifier being configured to output an analogue difference voltage to the switch, the analogue difference voltage representing a difference voltage between the first analogue voltage signal and the second analogue voltage signal.

In some of the above-mentioned embodiments, the processor is configured to: determine a first parameter indicative of the complex amplitude of a voltage across the electrical component, and a second parameter indicative of the complex amplitude of the difference between the voltage across the electrical component and the fourth voltage or the voltage difference; multiply each of the first and second determined parameters by the complex conjugate of the second determined parameter to generate third and fourth parameters respectively; and compare the third and fourth parameters to generate the proximity monitor signal, or compare one or more components or derivatives of the third parameter and one or more components or derivatives of the fourth parameter to generate the proximity monitor signal.

The processor may also be configured to include an averaging process in the generation of the third and fourth parameters.

The processor may also be configured to multiply the voltage across the electrical component by a factor based on a complex conjugate signal of which the generated signal generated by the signal generator is a part to determine the first parameter, to multiply the fourth voltage by the factor to determine an interim parameter, and to subtract the first parameter from the interim parameter to determine the second parameter.

Alternatively, the processor may be configured to multiply the voltage across the electrical component by a factor based on a complex conjugate signal of which the generated signal is a part to determine the first parameter, to determine a difference voltage using the voltage across the electrical component and the fourth voltage, and to multiply the difference voltage by the factor to determine the second parameter.

Alternatively, the processor may be configured to multiply the voltage across the electrical component by a factor based on a complex conjugate signal of which the generated electrical signal is a part to determine the first parameter, and to multiply the voltage difference measurement by the factor to determine the second parameter.

The processor may also be configured to multiply each digital voltage measurement by the factor and to sum each of the digital voltage measurements multiplied by the factor over a plurality of digital samples.

Furthermore, the processor may be configured to compare the third and fourth parameters using a constant, wherein the constant is dependent upon an impedance or at least one component of impedance of the impedance component. In such circumstances, the processor may be configured to compare the third and fourth parameters to generate the output by comparing the result of multiplying each fourth parameter by the constant with each third parameter; wherein the constant includes the reciprocal of the impedance or part thereof of the impedance component.

The processor may be configured to determine an estimate of noise in the measurements using averages of the third and fourth parameters over a plurality of measurements, and to ignore the current comparison of the third and fourth parameters if the noise is above a threshold.

In some embodiments of the proximity sensor monitor, the impedance component of the proximity sensor is connected in series to the electrical component of the proximity sensor, the impedance component having a first end connected to a first end of the electrical component and a second end connected to the signal generator of the proximity sensor. Furthermore, the first input of the proximity sensor monitor is coupleable to the first end of the impedance component and the second input is coupleable to the second end of the second end of the impedance component. In such embodiments, the first analogue voltage signal is an analogue voltage signal at the first end of the impedance component, and the second analogue voltage signal is an analogue voltage signal at the second end of the impedance component.

In other embodiments of the proximity sensor monitor, the electrical component of the proximity sensor has a first end and a second end, the impedance component of the proximity sensor has a first end and a second end, the second end of the impedance component being connected to the second end of the electrical component, the signal generator of the proximity sensor being connected to the first end of the electrical component. In such an embodiment, the proximity sensor also comprises an operational amplifier having an inverting input, a non-inverting input and an output, wherein the second ends of the electrical and impedance components are connected to the inverting input of the operational amplifier, and the first end of the impedance component is connected to the output of the operational amplifier. In such embodiments, the first input of the proximity sensor monitor is coupleable to first end of the electrical component and the second input of the proximity sensor monitor is coupleable to the first end of the impedance component. In such an embodiment, the first analogue voltage signal is an analogue voltage signal at the first end of the electrical component, and the second analogue voltage signal is an analogue voltage signal at the first end of the impedance component.

The present invention also provides a proximity sensor system for sensing the proximity of a target comprising: an electrical component for sensing the proximity of a target, the electrical component having electrical properties that vary with the proximity of the target; an impedance component having a known impedance and a first end connected to a first end of the electrical component; a switch connected to switch between the first end of the impedance component and a second end of the impedance component; a signal generator connected to the second end of the impedance component for generating an electrical signal for application to the series connected impedance component and electrical component; an analogue-to-digital converter coupled to the switch for receiving an analogue signal and for generating a digital voltage signal; a processor connected to the analogue-to-digital converter for receiving the digital voltage signal and for generating a proximity signal; and a proximity sensor monitor as described above, the proximity sensor monitor switch being coupled between the first end of the impedance component and the second end of the impedance component; wherein the proximity sensor switch is coupled to switch between the first end of the impedance component and the second end of the impedance component, and wherein the processor is adapted to control the proximity sensor switch to switch to connect to the first and second ends of the impedance component sequentially.

By providing a separate proximity sensor comprising a proximity sensor monitor having a separate measurement path to common electrical and impedance components enables separate measurement and monitoring of the proximity of a target, thereby satisfying the Functional Hazard Analysis requirements. Since the measurement path of the proximity sensor monitor is independent of the proximity sensor, however, the excitation frequency used to generate the proximity monitor signal and the excitation frequency used to generate an electrical signal applied to the series connected electrical and impedance components by a signal generator of the proximity sensor will be different. As such, the processor of the proximity sensor monitor is advantageously configured to compensate for this difference, which would otherwise cause the independent measurements to differ by too large a degree to give the user any confidence in the measurements.

The signal generator of the proximity sensor may be adapted to generate the signal comprising sequential signal blocks for application to the series connected electrical component and impedance component, wherein the switch arrangement is configured to switch a measurement channel comprising the analogue-to-digital converter to measure each of a first voltage and second voltage at respective first and second ends of the impedance component during the same part of the signal block of sequential signal blocks of the signal. Preferably, the signal generator may includes a digital store storing a signal pattern for at least a part of a signal block, generator means for generating a digital signal by repeatedly using the stored signal pattern, and a digital-to-analogue converter for converting the digital signal to the signal. Preferably, the signal generator and the processor are adapted to operate synchronously.

In some embodiments, the proximity sensor system may include a plurality of measurement channels for measuring the voltages, wherein the switch is adapted to switch each of the measurement channels to sequentially measure the voltages to allow simultaneous measurements in the measurement channels, and the processor is configured to process the sequentially measured voltages for each channel. Preferably, the processor may comprise a digital processing arrangement, and the measurement channels include a common multiplexer arrangement and a common analogue-to-digital converter.

The processor may be adapted to generate the output as a measure of impedance or at least one component of the impedance of the impedance component. Furthermore, the processor may be configured to generate the output as an indication of whether or not a factor related to the impedance or at least one component thereof is above or below a threshold.

In some embodiments of the proximity sensor system, the processor is configured to: determine a first parameter indicative of the complex amplitude of a first voltage on a first side of the impedance component connected to the electrical component, and a second parameter indicative of the complex amplitude of the difference between the first and second voltages or the voltage difference; multiply each of the first and second determined parameters by the complex conjugate of the second determined parameter to generate third and fourth parameters respectively; and compare the third and fourth parameters to generate the output, or compare one or more components or derivatives of the third parameter and one or more components or derivatives of the fourth parameter to generate the output. Preferably, the processor may be configured to include an averaging process in the generation of the third and fourth parameters.

In such embodiments, the processor may be adapted to multiply the first voltage measurement by a factor based on a complex conjugate signal of which the generated signal is a part to determine the first parameter, to multiply the second voltage measurement by the factor to determine an interim parameter, and to subtract the first parameter from the interim parameter to determine the second parameter.

Alternatively, the processor may be configured to multiply the first voltage measurement by a factor based on a complex conjugate signal of which the generated signal is a part to determine the first parameter, to determine a difference voltage using the first and second voltage measurements, and to multiply the difference voltage by the factor to determine the second parameter.

Alternatively, the processor may be configured to multiply the first voltage measurement by a factor based on a complex conjugate signal of which the generated electrical signal is a part to determine the first parameter, and to multiply the voltage difference measurement by the factor to determine the second parameter.

Furthermore, the processor may be configured to multiply each voltage measurement by the factor and to sum each of the digital voltage measurements multiplied by the factor over a plurality of digital samples.

In some embodiments, the signal generator may be configured to generate the electrical signal comprising a plurality of frequency components and the processor is configured to determine a first parameter indicative of the complex amplitude of the first voltage on the first side of the impedance component for each the frequency, and a second parameter indicative of the complex amplitude of the difference between the first and second voltages or the voltage difference for each the frequency, to multiply each of the first and second determined parameters by the complex conjugate of the second determined parameter to generate third and fourth parameters respectively, and to compare the third and fourth parameters to generate the output, or compare one or more components or derivatives of the third and fourth parameters to generate the output.

In further embodiments, the processor may be configured to compare the third and fourth parameters using a constant, wherein the constant is dependent upon an impedance or at least one component of impedance of the impedance component. Preferably, the processor may be configured to compare the third and fourth parameters to generate the output by comparing the result of multiplying each the fourth parameter by the constant with each the third parameter; wherein the constant includes the reciprocal of the impedance or part thereof of the impedance component.

The processor may also be adapted to determine an estimate of noise in the measurements using averages of the third and fourth parameters over a plurality of measurements, and to ignore the current comparison of the third and fourth parameters if the noise is above a threshold.

The processor may also be configured to monitor the output to detect fault conditions in the impedance component and to output a warning output if a fault condition is detected. Preferably, the processor is configured to detect a fault condition when an output is outside a threshold or range.

The proximity sensor system may also further comprise a comparison unit having an input for receiving the proximity signal and an input for receiving the proximity monitor signal, the comparison unit being configured to compare the proximity signal and proximity monitor signal to determine a fault condition in which the difference between the signals is greater than a threshold, and configured to output a warning output if a fault condition is detected.

In any of the above-mentioned embodiments, the electrical component may comprise an inductor or a capacitor. Furthermore, the impedance component may comprise a resistor or an inductor.

The present invention also provides a proximity sensor system for sensing the proximity of a target comprising: an electrical component for sensing the proximity of a target, the electrical component having electrical properties that vary with the proximity of the target; an impedance component having a known impedance and a first end connected to a first end of the electrical component; a signal generator connected to the second end of the impedance component for generating an electrical signal for application to the series connected impedance component and electrical component; a first analogue-to-digital converter coupled to the first end of the impedance component for receiving an analogue signal and for generating a first digital voltage signal; a second analogue-to-digital converter coupled to the second end of the impedance component for receiving an analogue signal and for generating a second digital voltage signal; a processor connected to the first and second analogue-to-digital converters for receiving the first and second digital voltage signals and for generating a proximity signal; and a proximity sensor monitor as described above, the proximity monitor switch being coupled between the first end of the impedance component and the second end of the impedance component.

The present invention also provides a proximity sensor system for sensing the proximity of a target comprising: an electrical component for sensing the proximity of a target, the electrical component having a first end and a second end and having electrical properties that vary with the proximity of the target; an impedance component having a known impedance and a first end and a second end, the second end being connected to the second end of the electrical component; a signal generator connected to the first end of the electrical component for generating an electrical signal for application to the electrical component; an operational amplifier having an inverting input, a non-inverting input and an output, wherein the second ends of the electrical and impedance components are connected to the inverting input of the operational amplifier, and the first end of the impedance component is connected to the output of the operational amplifier; a switch connected to switch between the first end of the electrical component and the output of the operational amplifier; an analogue-to-digital converter coupled to the switch for receiving an analogue signal and for generating a digital voltage signal; a processor connected to the analogue-to-digital converter for receiving the digital voltage signal and for generating a proximity signal; and a proximity sensor monitor as described above, the proximity monitor switch being coupled between the first end of the electrical component and the output of the operational amplifier; wherein the proximity sensor switch is coupled to switch between the first end of the electrical component and the output of the operational amplifier, and wherein the processor is adapted to control the proximity sensor switch to switch to connect to the first end of the electrical component and the output of the operational amplifier sequentially.

BRIEF DESCRIPTION OF THE DRAWINGS

Embodiments of the present invention will now be described, by way of example only, and with reference to the accompanying drawings, in which.

DETAILED DESCRIPTION OF THE PREFERRED EMBODIMENTS

In brief, the present invention provides a proximity sensor monitor which measures the impedance or other electrical characteristics of a proximity sensor component to determine the presence of a target. The proximity sensor monitor performs this measurement independently of the separate proximity sensor. Since the proximity sensor monitor measurements need to be independent of the proximity sensor measurements, and given that the proximity sensor is driven by an alternating voltage at a particular frequency, or frequencies, the proximity sensor monitor is configured to compensate for differences between the measurement frequency of the proximity sensor monitor and the driving frequency of the proximity sensor. The output of the proximity sensor and proximity sensor monitors may be a measurement or indication of an impedance value, which depends on the proximity of a target. The proximity sensor output and the proximity sensor monitor outputs may alternatively be an indication that the target is "near" (i.e. within a predetermined range of the proximity sensor) or "far" (i.e. outside of a predetermined range of the proximity sensor).

We shall first discuss some background generally in the field of sensing.

In an electrical system where it is desirable to measure or monitor the impedance or part thereof of a device, in the prior art it has been necessary to measure the current and voltage and to take the ratio in order to determine the impedance or part thereof in order to identify a change in impedance or part thereof. Such a device can for example comprise a proximity sensor. Such a sensor is disclosed in WO 01/65695, the content so which are hereby incorporated by reference. A sensor of this type provides a proximity measure whereby when a target is in the proximity of the device the impedance (or a component of impedance) of the device changes. WO 01/65695 discloses a method of proximity sensing in which the impedance of the proximity sensor is measured in order to detect a change of impedance.

Figure 1:
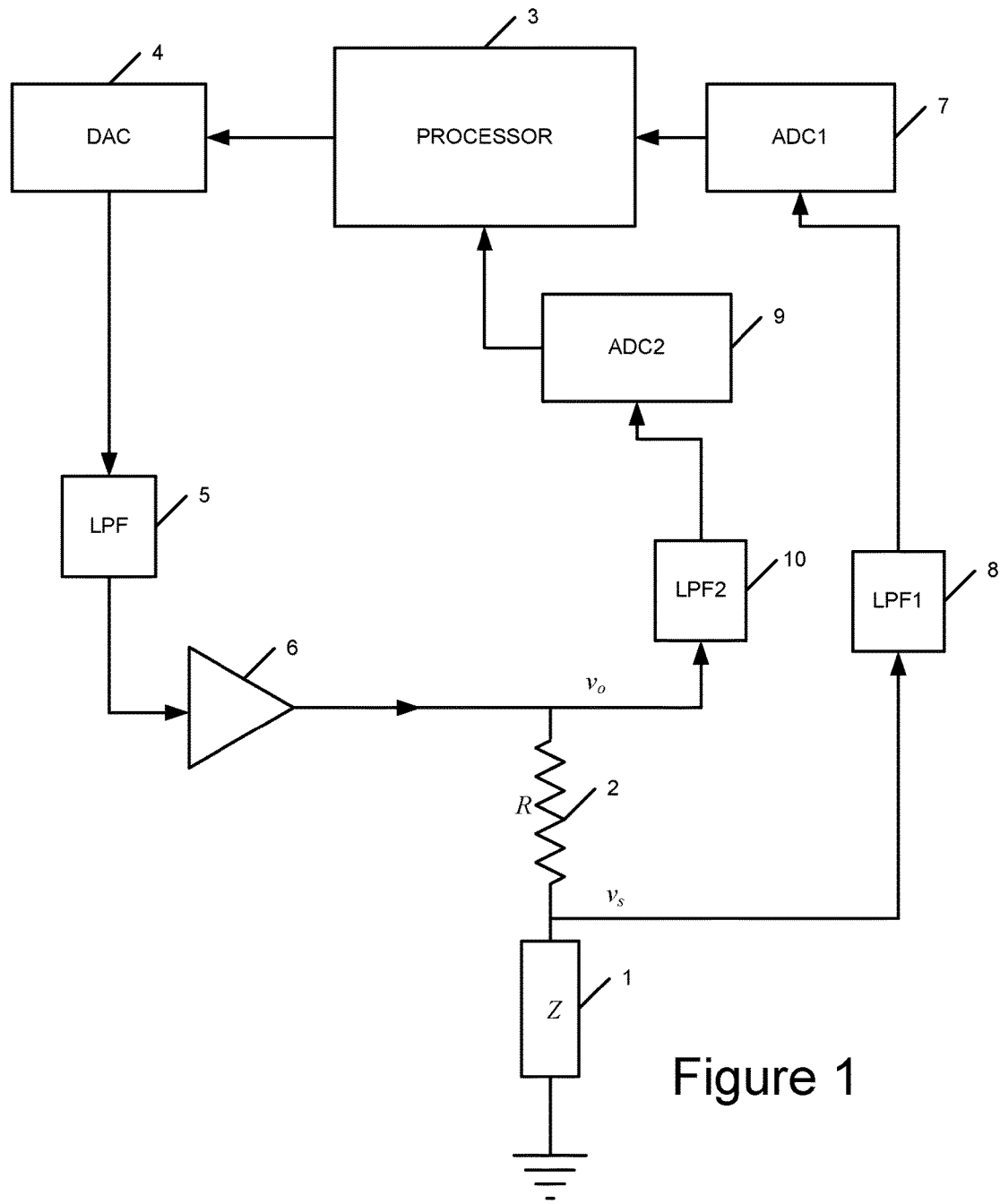
FIG. 1 is a schematic diagram of a prior art proximity sensor system.

A known measurement system for use with proximity sensors such as that disclosed in WO 01/65695 is illustrated in FIG. 1. The proximity sensor 1 has an impedance Z which is required to be measured. The proximity sensor 1 is connected to earth and to a load resistance 2. A processor 3 is provided to digitally generate a drive wave form which is digital-to-analogue converted in a digital-to-analogue converter 4 to generate an analogue drive signal which is input through a low pass filter 5 and amplified by an amplifier 6 before being applied across the series connected load resistance 2 and proximity sensor 1. A voltage $v_S$ is measured as the voltage across the proximity sensor 1 by connecting a first analogue-to-digital converter 7 via a low pass filter 8. The output of the analogue-to-digital converter 7 is input to the processor 3. A second voltage $v_o$ is measured as the voltage across the series connected load resistance 2 and the proximity sensor 1. A second analogue-to-digital converter 9 receives the voltage signal $v_o$ via a second low pass filter 10 and inputs a digital representation of a voltage $v_o$.

In the prior art proximity sensor such as disclosed in WO 01/65695 the sensor typically consists of a coil with or without a core of permeable material. The provision of the core allows directing of the magnetic flux of the coil and enhancement of the inductance. Directing of the flux allows the designer to have control over the direction of sensitivity of the centre assembly.

As can be seen in FIG. 1, the sensor 1 is driven by a drive signal having a voltage and a resulting current which is of fluctuating nature and which can be sinusoidal or transient to allow the impedance to be evaluated.

If a sinusoidal voltage at angular frequency $\omega$ is applied, the voltage and resulting current are expressed as:

$$v_o(t) = \text{real}(V_o(\omega)e^{j\omega t})$$

and $$i(t) = \text{real}(I(\omega)e^{j\omega t})$$

where $V_o(\omega)$ and $I(\omega)$ are the complex amplitudes. All of the voltages and currents in the circuit, not just these two, can be similarly expressed via complex amplitudes.

Impedance $Z(\omega)$ at the frequency $\omega$ is defined as:
$Z(\omega) = V_s(\omega)/I(\omega)$.

Also, impedance $Z(\omega)$ comprises:
$Z(\omega) = R + j\omega L$.
or
$Z(\omega) = R + 1/(j\omega C)$.

where R is the resistive component (the real component of impedance), L is the inductive component, and C is the capacitive component. It should be noted that the imaginary part of the impedance is frequency dependent and is usually termed the reactive component.

The portion of the current that is in phase with the voltage is often referred to as real or dissipative (or simply in phase) and is associated with the resistive behaviour of the coil and cables. The portion of the current that is in 'phase quadrature' or at 90 degrees to the voltage is often referred to as the imaginary, quadrature, or reactive component. It is associated with energy storage in the coil's electromagnetic fields, either due to its self-capacitance (electrostatic energy storage) or inductance (magnetic energy storage), or both.

The current is normally sensed by measuring the voltage produced by the current flowing through a known constant resistance in series with the coil and by using Ohm's law:

$$I(\omega)=\Delta V(\omega)/R$$

where $\Delta V(\omega)$ is the complex amplitude of the voltage across the load resistance 2.

It can thus be seen from FIG. 1 that in order to determine the impedance the $v_s$ measure provides the complex voltage applied to the sensor 1 and the current can be determined from the voltage difference between the voltage measures $v_o$ and $v_s$ and the value of the load resistance 2.

Thus within the processor 3, the simultaneous measurements of $v_o$ and $v_s$ are used to determine the complex voltage and current applied to the sensor 1 in order to determine an impedance value for the sensor 1.

The impedance and/or inductance of the sensor's coil are altered by the presence of a nearby metallic target. The target alters inductance in the following ways. If a target is made from a material with permeability greater than the normal medium surrounding the coil, then its presence enhances the magnetic field coupling through and around the coil, and so increases its inductance. It should be noted that the permeability of some materials is affected to some degree both by the excitation frequency, by temperature, and by other magnetic fields. If the target is a permanent magnet, then drawing it near to the core induces magnetic flux in the core. This forces the core nearer to its magnetic saturation which, with well-behaved magnetization or 'BH' curves, reduces core permeability. The reduction in permeability appears as a reduction in the reactive component of the impedance and hence reduction in inductance. If the target is made from a conductive material, the eddy currents induced in the target by the fluctuating magnetic field of the coil generate their own field, which substantially opposes that produced by the coil. The net field appears as a reduced field to the coil, which incurs a reduction in inductance as the target approaches the coil. In addition, the eddy currents in the target introduce energy loss that appears in the sensor's impedance as an increase in resistance.

Thus in the prior art in order to detect a change in inductance of the sensor 1, a very accurate load resistor 2 is placed in series with the sensor 1 to act as a current sensor.

Two voltage measurements are taken across the load resistor 2 simultaneously using two measurement channels comprising low pass filters 8, 10 and analogue-to-digital converters 7, 9. Within the processor 3 a value for the impedance Z is calculated by taking a ratio of the processed measurements. Thus in order to determine the impedance to high accuracy, it is necessary for the measurement channels to be closely matched and to include high precision components. Further, the prior art system requires an expensive, close-tolerance, series sense resistor to provide for current sensing. In addition, computation implemented within the processor 3 requires a division for computation of impedance. Such a division is computationally expensive and requires protection from out of range results such as divide by 0.

Figure 2:
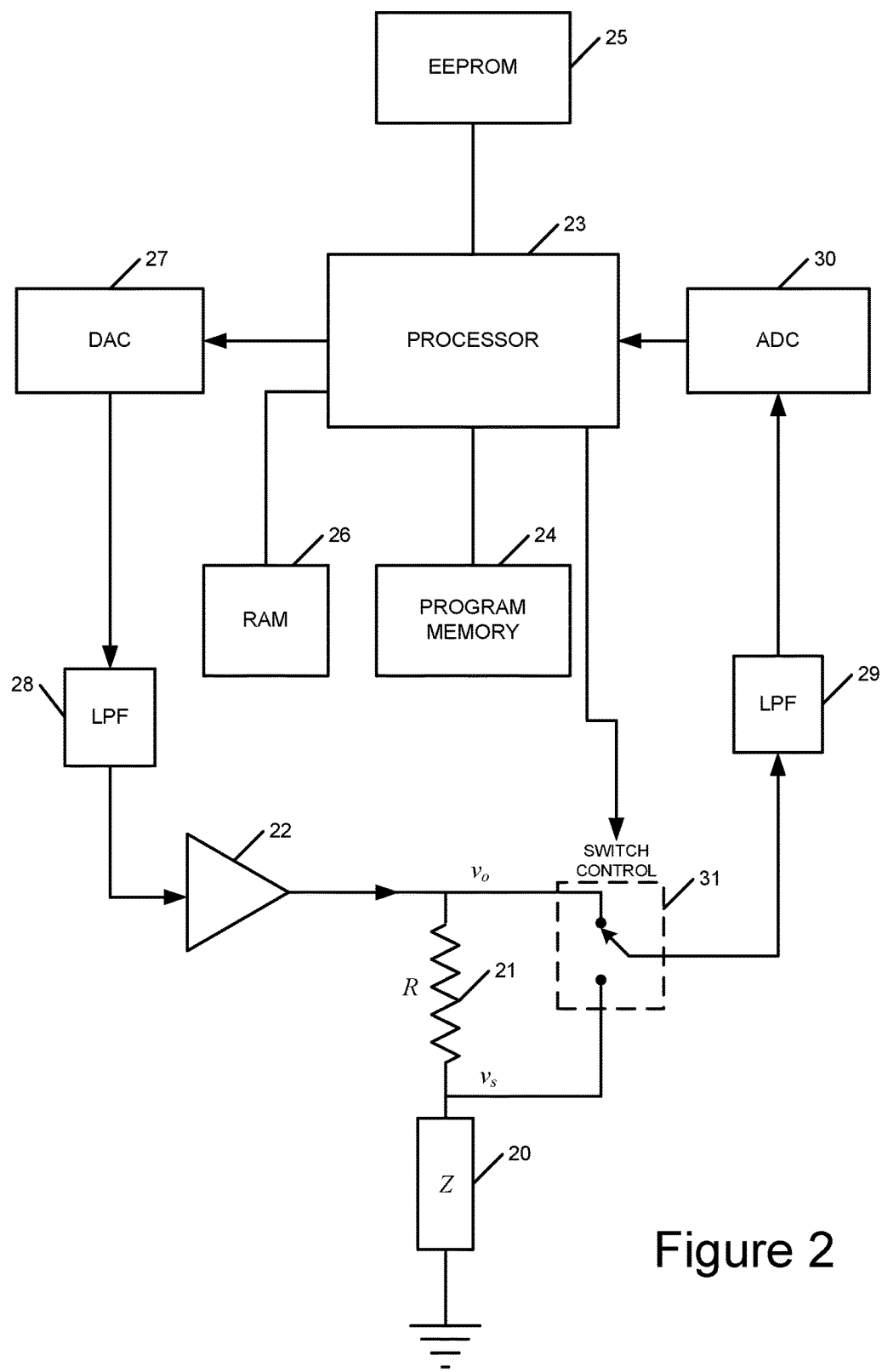
FIG. 2 is a schematic diagram of a second prior art proximity sensor system.

In order to address the problems associated with the proximity sensor of FIG. 1, our prior application WO2005/085883 provided the proximity sensor as shown in FIG. 2.

FIG. 2 illustrates a system for the determination of a change of impedance of a device such as a proximity sensor 20. A load resistance (or impedance component) 21, which is temperature and age stable and whose value is known and stored within the processing system is connected in series with the device (or electrical component) 20. The device or electrical component 20 may, for example, be an inductive coil that has an inductance that varies with the proximity of a target, such as that described in WO01/65695.

One end of the load resistance 21 is connected to an amplifier 22, which generates a drive signal comprising at least one sinusoidal signal. The other end of the load resistance 21 is connected to the device 20. A processor 23 is provided with a program memory 24 to control the operation of the processor. An erasable programmable read-only memory (EEPROM) 25 is provided to store data to be used by the processor 23. The data stored in the EEPROM 25 can include waveform generation data comprising a digital representation of at least a part of a waveform. Alternatively this can be stored in the program memory 24 or the random access memory (RAM) 26. The processor 23 is thus able to read the data from the EEPROM 25 in order to generate a continuous digital waveform which in this embodiment comprises a single wave form for simplifying explanation hereinafter. The storage of the waveform within the EEPROM 25 (or other memory location) makes the production of the digital drive waveform simple. A processor 23 is not required to perform calculations in order to determine output values for a cyclical waveform; instead values are simply repeatedly read out of the EEPROM 25.

A random access memory (RAM) 26 is provided to enable the processor 23 to store data during processing.

The digital drive signal output from the processor 23 is input to a digital-to-analogue converter 27 to generate an analogue wave signal which is passed through a low pass filter 28 and input to the amplifier 22 to generate the drive signal to the load resistor 21. The low pass 'reconstruction' filter 28 reduces undesirable artefacts of the digital-to-analogue conversion process. In an alternative embodiment the DAC 27 can be replaced with a pulse width modulated digital output directly from the processor 23.

The resistance value of the load resistor 21 can be stored in the EEPROM 25, the program memory 24 or the RAM 26 for use in data processing. In fact to avoid the requirement for a division in the computation, the reciprocal of the resistance value may be stored so that a multiplication operation can be used in the calculation instead.

The processor 23, the DAC 27, the ADC 30, the EEPROM 25, the RAM 26 and the memory 24 can all be provided on a microcontroller such as the Microchip PIC series. Thus the microcontroller can perform the function of signal generation and signal processing.

A single measurement channel is provided comprised of a low pass filter 29 and an analogue-to-digital converter 30 to provide a digitised input to the processor 23. The measurement channel is connected to a switch arrangement 31, which receives as inputs connections from either side of the load resistor 21. The switch arrangement is controlled by a control signal from the processor 23 to switch between measurements of the voltages $v_o$ and $v_s$ either side of the load resistor 21.

The processor 23 controls the generation of the sinusoidal output signal to be in synchronism with the measurements input from the analogue-to-digital converter. Thus the waveforms are generated and measured synchronously. The processor 23 can comprise a microcontroller to control the output as well as the acquisition of the input samples. The output sequence comprises a block of samples during which the switch 31 is controlled so that the measurement channel measures the voltage on one side of the load resistor 21 i.e. during one measurement period. The block of samples may contain any multiple of cycles of a periodic waveform, such as a single sinusoid. The processor 23 then controls the switch 31 to switch to receive measurements of the voltage on the other side of the load resistor 21 and during this measurement period the processor 23 outputs a sequence identical to the previous sequence. Thus during pairs of measurement periods the output sequences are identical. It is thus preferable for the successive measurements to occur over successive blocks. The blocks need not be consecutive. It is possible for there to be a quiescent period between measurements, or the blocks can be filled with an initial number of zeros. However, to avoid latency it is preferred that measurements are taken successively and each measurement period comprises a whole block of data. In order to compensate for any transient factors, it is possible for the first part of the responses to the output to be discarded or not measured to allow for settlement. It is preferred that the measurements be taken during the same section of successive blocks to avoid for the need for any phase compensation. However, the system is able to compensate for different phase measurements if required. The blocks themselves may be different from one pair of measurements to the next.

As can be seen, since there is only one measurement channel comprising the low pass filter 29 and the analogue-to-digital converter 30, there is no requirement for accurate gain and phase matching of two filters and analogue-to-digital converters. Since all measurements are carried out using a single measurement channel, all measurements are equally affected by the characteristics of the measurement channel and thus in the calculations these factors cancel out.

Thus measurements are provided to the processor in successive blocks of the voltage $v_s$ on one side of the load resistor 21 which comprises the voltage applied across the device 20. The other voltage measurement obtained is the voltage $v_o$ on the drive side of the load resistor 21.

In FIG. 2 the load resistance 21 is provided to enable the determination of the current flowing through the device 20. The complex amplitude of the current can be calculated using Ohm's law as follows:

$$I = \frac{V_o - V_s}{R}$$

where $V_o$ and $V_s$ are the complex amplitudes at some frequency of $v_o$ and $v_s$.

The impedance of device 20 at this frequency is given by:

$$Z = V_s/I$$

Therefore:

$$Z = \frac{V_s R}{V_o - V_s}$$

It can be seen from this equation that impedance can be calculated from the ratio of the two complex voltage amplitudes taking into consideration the load resistance. In other words the value of the impedance is dependent upon the ratio of the voltage across the device and the voltage difference across the load resistance 21.

In one version of the system, the sequential measurements can be used to calculate the impedance. To detect a change of impedance, or in the case of the device being a proximity sensor, to detect the proximity of a target, the impedance value can be compared with a threshold impedance value to determine the proximity of a target to the sensor.

Such versions that involve the calculation of the impedance, however, require for a computationally expensive division operation to be carried out. Such divisions, also can result in out of range results e.g. a divide by zero operation which can be caused by noise.

A preferred version does not result in the calculation of an absolute value for impedance. Instead quantities derived from the $V_s$ and the $V_o$-$V_s$ are compared to identify a change in the relative values. This can be used to compare the relative values with a threshold.

The explanation of the operation of the measurement and processing is complicated by the fact that the drive signal generation and processing is performed digitally and the measurements comprise complex values for the voltage including phase and amplitude information. Also, impedance is complex:

$$Z = R + j\omega L$$

In this simplified version, the output drive signal comprises a sinusoidal signal at a predetermined angular frequency $\omega$. Samples of this signal will be clocked out of the digital-to-analogue converter at a sample frequency $f_s = 1/\tau$, where $\tau$ is the sample period. Each block of the samples can be denoted by:

$$v_{on} = \text{real}(V_o z^n) \text{ for } n = -P \text{ to } M-1$$

where $z = e^{j\omega\tau}$, $V_o$ is the complex amplitude of the output voltage, P is a positive integer or zero indicating the number of samples of the block which may be zeroed to allow for settling, and M is a positive integer.

Normally there is no point in choosing $V_o$ to be anything other than 1 since the units of the signal are arbitrary and there is no point in requiring a complex multiplication to be performed as each output sample is generated. Typically therefore only the real part of $z^n$ is needed to generate the output. These values are calculated and stored in the EEPROM memory 25 or program memory 24 beforehand, or they can be precomputed and stored in the RAM 26.

There may be occasions when the phase of the output drive signal is desired to be varied from one pair of blocks to another pair of blocks to help decorrelate it from an otherwise phase-locked interfering signal (such as cross-talk from another sensing system running at precisely the same frequency). In this case, both the real and imaginary components of $z^n$ will preferably be pre-calculated and stored so that an output of arbitrary initial phase can be generated.

Due to periodicities and symmetries in the output sequence, it is possible to store fewer than P+M values of $z^n$ and still be able to generate the entire output sequence without any additional arithmetic operations. The storage of such a partial representation of the generated waveform reduces the memory requirement.

As the output sequence is generated by the processor 23, one of the continuous-time input signals v(t) is synchronously sampled to yield a sequence of input samples, $v_n$ for n=0 to M−1, (where the first P samples of the block have been discarded or not measured to allow for settling). Each sample is then multiplied by $z^{-n}$ i.e $e^{-j\omega t}$ (a phase inverse of the complex generated signal of which the generated sinusoidal signal is a part). The digitised values $z^{-n}$ for $e^{-j\omega t}$ are stored in the EEPROM 25 (or program memory 24 or RAM 26) to avoid the need to calculate them in real time. The result is the weighted sequence which is summed over the M terms to yield an estimate of the complex amplitude V of the signal at angular frequency ω. This can be represented as:

$$v(t) = \text{real}(V(\omega)e^{j\omega t}) + \sigma(t)$$

where σ denotes any components in the signal that are not desired (e.g. noise), then $$v_n = \text{real}(V(\omega)z^n) + \sigma_n$$

and $$\sum_{0}^{M-1} v_n z^{-n} = \frac{MV}{2} + \frac{1}{2}\sum_{0}^{M-1} V^* z^{-2n} + \sum_{0}^{M-1} \sigma_n z^{-n}.$$

The second term on the right hand side is oscillatory with M, and therefore loses significance relative to the first term if M is large. The third term on the right hand side can also be neglected for large enough M provided the "noise" is uncorrelated with the output drive signal. It is particularly advantageous if $f_s$ be chosen such that $$f_s = \frac{N\omega}{2\pi}$$

where N is a positive integer, and M is chosen such that M=pN, where p is also a positive integer. In this special case, the second term on the right hand side above is zero. In any case, the estimate of V, denoted $\hat{V}$, is given by $$\frac{M\hat{V}}{2} = \sum_{0}^{M-1} v_n z^{-n}$$

This requires just two multiplications and additions at each sample point, and is therefore extremely economical on processing power. A basic microcontroller can manage this with less than 10% of its processing ability at useful sample rates.

In systems with more than one sinusoid component in the output drive signal, it is particularly advantageous if the frequencies of those components each obey the relation:

$$\omega_p = 2\pi f_s \frac{p}{M}$$

$$0 \leq p \leq \frac{M}{2}$$

where p is a positive integer, and $\omega_p$ is the angular frequency of the $p^{th}$ component.

In this case, whole cycles of each of the components fit within the M samples that are used in the calculation of the estimates of the complex voltage amplitudes. These estimates are calculated in a way analogous to that used for a single frequency system, viz.

$$\frac{M\hat{V}_p}{2} = \sum_{0}^{M-1} v_n z_p^{-n}$$

where $\hat{V}_p$ is the complex amplitude of the voltage component at angular frequency $\omega_p$ and $z_p = e^{j\omega_p \tau}$. If there is a special relationship among the excitation frequencies of a multi-frequency system, it is often possible to avoid storing a complete set of the weights $z_p^n$ for each frequency component because many of the weights will be common to more than one component. For example if p=1, 2 in a two-frequency system, at most only the weights $z_1^n$ (n=0 to M−1) need be stored, as the weights $z_2^n$ are already contained within, and can be picked out of the $z_1^n$.

A window function can be applied to a sample block in order to reduce windowing effects. The window function can easily be incorporated by modifying the weights $z^{-n}$ with the window weight (say $w_n$) and pre-storing the result $w_n z^{-n}$ in the EEPROM 25. Such window functions are well known in the art. This can mean that some additional storage is required for the modified weights, but no additional arithmetic operations are needed to form the estimate of V. Alternatively the values stored for the signal samples can be a combination of $z^{-n}$ and the window weights to avoid the need for additional storage and pre-calculation at run time. The window function can also overcome start-up transients by including leading zeros.

Another method of estimating V would be to low-pass filter the weighted input sequence. This is really just another form of averaging, and could be performed by e.g. convolving the weighted sequence with the impulse response of the chosen filter. Alternatively, the unweighted input sequence could be convolved with the impulse response of a band-pass filter with its pass-band centred substantially at an angular frequency of ω. These alternatives will require more computation and storage, however. Both of these alternatives could also be implemented "in the frequency-domain", in which case a Fast Fourier Transform (FFT) of the weighted or unweighted input sequence is typically taken prior to modifying it by the transfer function of the chosen filter. (In these cases, M will normally be chosen to be a power of 2). These alternatives also require more computation. These alternatives are also applicable to signals containing more than one frequency component.

The above process, applied to the two consecutively measured input signals (or "block-pair"), will yield $$\frac{M\hat{V}_S}{2} \equiv \hat{A}_S, \text{ say, and } \frac{M\hat{V}_o}{2} \equiv \hat{A}_o$$

where $\hat{V}_S$ and $\hat{V}_o$ are the complex voltage amplitude estimates measured by the system at the device 20 and at the output of the amplifier 22 respectively (i.e. at either end of the load resistor 21). The difference value is then calculated using $\hat{A}_R = \hat{A}_o - \hat{A}_S$. Cross- and auto-power spectral estimators are then formed as $$\hat{S}_{RS} = \hat{A}_S \hat{A}_R^*$$

and $$\hat{S}_{RR} = \hat{A}_R \hat{A}_R^*.$$

where $\hat{A}_R^*$ is the complex conjugate of $\hat{A}_R$.

These quantities can be further averaged (e.g. over several block-pairs) if their variances are desired to be reduced.

It should be noted that the multiplication of the complex first and second parameters $\hat{A}_R$ and $\hat{A}_S$ by $\hat{A}_R^*$ causes the product $\hat{A}_R\hat{A}_R^*$ to be generated, which is real. This facilitates the comparison of the third and fourth parameters $\hat{S}_{RS}$ and $\hat{S}_{RR}$, and avoids the need to perform computationally complex division of the parameters since it facilitates a threshold comparison. Also, this facilitates the averaging of measurements or parameters.

The thresholding of the results, in order to identify a threshold change in impedance can be summarized as the determination of any one of the following:

real($\hat{S}_{RS}$)>H$\hat{S}_{RR}$? (threshold on the linear resistive part of the impedance)

imag($\hat{S}_{RR}$)>H$\hat{S}_{RR}$ ? (threshold on the linear reactive part of the impedance)

or abs ($\hat{S}_{RS}$)>H$\hat{S}_{RR}$ ? (threshold on the magnitude of the linear part of the impedance) (or, equivalently, $\hat{S}_{RS}\hat{S}_{RS}^*$>H$\hat{S}_{RR}^2$?), or more generally, real($\hat{S}_{RS}e^{j\phi}$)>H$\hat{S}_{RR}$? Etc. where $\phi$ is a quantity selected by the designer or derived as part of the processing or even more generally, $G_r$(real($\hat{S}_{RS}e^{j\phi}$))+$G_i$(imag(($\hat{S}_{RS}e^{j\phi}$))>H$\hat{S}_{RR}$ ? where $G_r$ and $G_i$ are arbitrary real functions selected by the designer or derived by the processing.

The above formulae can also be generalised to use an impedance measure derived from 2 different frequency measurements. This would take the form given below in one example $$\text{imag}(\alpha\hat{S}_{RS}(\omega_1)\hat{S}_{RR}(\omega_2)+\beta\hat{S}_{RS}(\omega_2)\hat{S}_{RR}(\omega_1))>H\hat{S}_{RR}(\omega_1)\hat{S}_{RR}(\omega_2)?$$

(this is a threshold on the linear reactive part of the weighted impedance measure), where $\omega_1$ and $\omega_2$ indicate measurements at 2 frequencies and $\alpha$ and $\beta$ are constants determining the weight applied to the measurements at frequency 1 and 2. This type of weighted sum comparison can obviously be generalized to the other types of thresholding listed above. The values $\alpha$, $\beta=\pm 1$ are particularly useful for forming measures of sums or differences of components of impedance at different frequencies for comparison with a threshold. This type of weighted sum can also be generalized to more than 2 frequencies without difficulty.

In the above versions the "$H_1$" transfer function is used. However as an alternative the "$H_2$" transfer function could be used and will give rise to the inequalities:

$\hat{S}_{SS}$real($\hat{S}_{SR}^*$)>H$\hat{S}_{SR}^*\hat{S}_{SR}$? (threshold on the linear resistive part of the impedance)

$\hat{S}_{SS}$imag($\hat{S}_{SR}^*$)>H$\hat{S}_{SR}^*\hat{S}_{SR}$? (threshold on the linear reactive (inductive) part of the impedance)

$\hat{S}_{SS}^*\hat{S}_{SS}$>H$\hat{S}_{SR}^*\hat{S}_{SR}$? (threshold on the magnitude of the linear part of the impedance) or more generally, $\hat{S}_{SS}$real($\hat{S}_{SR}e^{j\phi}$)>H$\hat{S}_{SR}^*\hat{S}_{SR}$? Etc. where $\phi$ is some constant chosen by the designer or derived by the process where $\hat{S}_{SS}=\hat{A}_S\hat{A}_S^*$ and $\hat{S}_{SR}=\hat{S}_{RS}^*$.

In setting the above thresholds, H will contain numerical constants relating to the system and the processing that can be pre-calculated and will not vary from one set of electronics to another. It will also contain the precise value (or its reciprocal) of the load resistance, which is stored in the EEPROM 25 (or other memory) following a calibration process or end-of-line test.

It is clear from the above that in order to identify whether a change in impedance (or at least one component of it) is above or below a threshold its actual value need not be computed and compared to a threshold. Instead, the relative values of two parameters related to the current and the voltage in the device can be compared to determine if their relationship is above or below a threshold.

In one embodiment hysteresis is added into the comparison in order to avoid 'hunting' when the impedance (or at least one component of it) fluctuates close to the threshold. Accordingly the threshold can be dependent upon the current state i.e. whether the quantity related to the current impedance (or at least one component of it) is above or below the threshold. In order for the system to generate an output the inequality is adjusted either by adjusting H or by adding a factor into either side of the inequality. Thus if the quantity related to the impedance component was above the threshold for a previous measurement, for example real($\hat{S}_{RS}$)>H$\hat{S}_{RR}$, the effective threshold is made smaller either by reducing H or by adding a factor to the left hand side of the inequality (or subtracting a factor from the right hand side of the inequality). Similarly if the quantity related to the impedance was below the threshold for a previous measurement, for example real($\hat{S}_{RS}$)≤H$\hat{S}_{RR}$, the effective threshold is made bigger either by increasing H or by adding a factor to the right hand side of the inequality (or subtracting a factor from the left hand side of the inequality).

Proximity Sensor Monitor

Given the above description of a proximity sensor, we will now describe the proximity sensor monitor according to the present invention.

Figure 3:
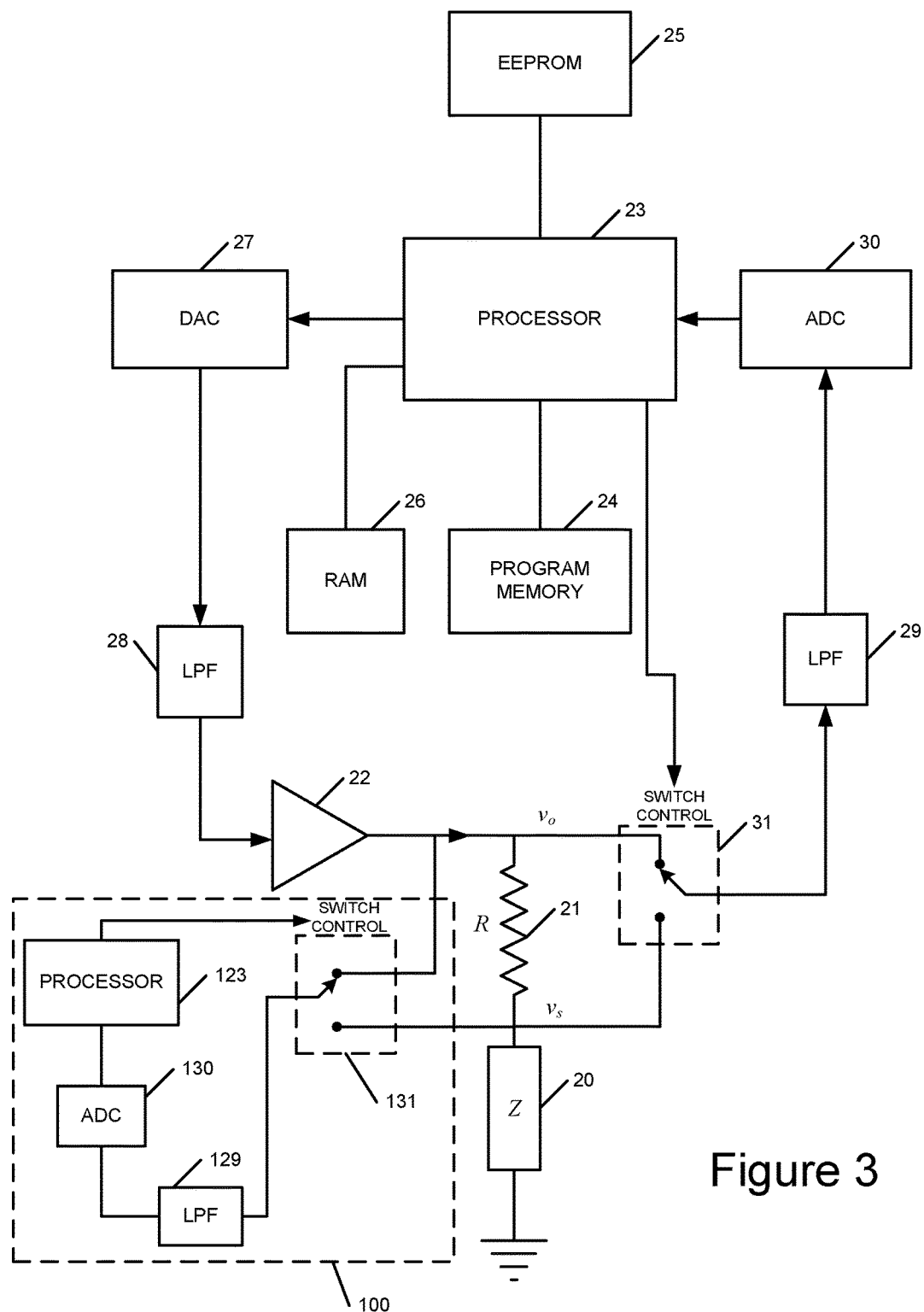
FIG. 3 is a schematic diagram of a first proximity measurement system incorporating a proximity sensor monitor according to the present invention.

FIG. 3 shows an example proximity sensor system, which comprises the proximity sensor monitor 100 coupled to the proximity sensor of FIG. 2. The proximity sensor operates as described above with reference to FIG. 2. In brief, the proximity sensor monitor works in a similar manner, only that the monitor processor 123 and monitor switch 131 operate independently of any clock signal that is coupled to the proximity sensor (and which drives the signal generation and switching of the proximity sensor).

The proximity sensor monitor comprises a switch 131 that is coupled to first and second inputs of the proximity sensor monitor. In this embodiment, the first and second inputs of the proximity sensor monitor are coupled respectively to a first end of the impedance component R 21 of the proximity sensor, and a second end of the impedance component R 21. In this configuration, the switch is therefore configured to switch between the first and second ends of the impedance component. Coupled to the switch output is an analogue-to-digital converter 130 (via for example a low pass filter 129), which receives the analogue voltage signal either side of the impedance component 21 (depending on which way the switch is switched), and which generates a digital voltage signal. A processor 123 is connected to the analogue-to-digital converter 130 and generates a proximity monitor signal.

In operation, the processor 123 controls the switch 131 to switch to measure the voltage sequentially either side of the impedance component 21 to generate the proximity monitor signal. The monitor signal is generated in the same way as the proximity sensor generates its proximity signal as described above with reference to FIG. 2. However, the measurements and calculations are performed completely independently of the proximity sensor measurements and calculations.

As described above, the output of the proximity sensor and proximity sensor monitor may be a measurement or indication of an impedance value, which depends on the proximity of a target. The proximity sensor output and the proximity sensor monitor outputs may alternatively be an indication that the target is "near" (i.e. within a predetermined range of the proximity sensor) or "far" (i.e. outside of a predetermined range of the proximity sensor). Once a result for each of the proximity sensor and proximity sensor monitors has been achieved, the outputs are compared to determine whether or not there is a fault condition, for example if the difference between the outputs is greater than a defined threshold. This comparison may be done digitally or in the analogue domain. In the case of the "near/far" determination, the comparison is simply "is the near/far determination the same?". If a fault condition is detected (i.e. the difference being greater than a threshold), a warning could be raised with the pilot or other crew to alert them to the fault condition.

This comparison may take place either in the proximity sensor monitor 100, or in the proximity sensor system, or both. Alternatively, the comparison may be performed by a unit separate to the proximity sensor and proximity sensor monitor systems, for example as part of a larger controller forming part of a different control system.

In order for the proximity sensor monitor to perform the measurements and calculations independently of the proximity sensor, the proximity sensor monitor has its own clock driving signal, independent from the clock signal driving the proximity sensor to reduce common mode failure probability. However, since the clock signal or excitation frequency used to generate the proximity sensor drive signal and the clock signal or excitation frequency used by the proximity sensor monitor to measure the voltages and generate the of the proximity sensor monitor signal are independent, there will likely be a frequency and/or phase offset between the two excitation frequencies. Without any compensation for the difference in frequencies, this will result in different measurement between the proximity sensor and proximity sensor monitor (since the proximity sensor monitor is unlikely to be sampling the signal either side of the impedance component at the same time as the proximity sensor, and the phase will be different between the measurements).

In practice, since the measurements are averaged over a plurality of cycles, a constant phase offset between the proximity sensor and proximity sensor monitor measurements will cancel out because a ratiometric measurement is used. However, a changing phase offset between the two (for example if the clocks drift in frequency relative to one another) will result in different calculations since the phase offsets will not cancel out.

In order to overcome this problem, the proximity sensor monitor processor 123 is configured to compensate for a frequency difference between an excitation frequency used to generate the drive signal of the proximity monitor and an excitation frequency used by the proximity sensor monitor to measure the voltages and generate the proximity sensor monitor signal. There are a number of schemes envisaged to perform this compensation.

In a first, preferred, embodiment of the frequency offset compensation, the processor switches the switch to measure $V_O$ and performs a Discrete Fourier Transform (DFT) on the first measured $V_O$ at a first time. This DFT reveals the phase of the first $V_O$. The switch then switches to measure $V_S$ and performs a DFT to reveal the phase of the $V_S$ at a second time. If there is a frequency offset between proximity sensor and proximity sensor monitor, the phase will have rotated between $V_O$ and $V_S$. The processor then switches back to measure a following $V_O$ and performs a DFT to reveal the phase of the second $V_O$ at a third time. The processor then uses the phases of the first and second $V_O$ measurements (i.e. the first and third measured voltages) to perform an interpolation to reveal what the phase of a $V_O$ measurement might have been if it a $V_O$ measurement was taken at the second time (i.e. the same time as the $V_S$ measurement). If the frequency offset is below a threshold, and assuming that the offset does not drift significantly over the measurement period between the first $V_O$ and the second $V_O$, the assumption is that the interpolated phase will equate to the phase of the $V_O$ signal if it were measured at the same time as the $V_S$ measurement. This calculated phase can then be used to apply a phase offset to either of the $V_O$ measurements such that the calculations of impedance may be performed as described above with reference to FIG. 2.

In alternative embodiments, the first and third measurements are $V_S$ measurements, and the second measurement is a $V_O$ measurement. In this embodiment, the interpolation is done using the $V_S$ measurements to determine a $V_S$ measurement that has a phase as if it were measured at the second time (i.e. at the same time as the $V_O$ measurement).

Linear or polar interpolation may be used. However, whilst polar interpolation likely provides a more accurate interpolation of the measurement, it is more computationally demanding than linear interpolation.

Preferably, the frequency offset between the two excitation frequencies varies less than 3.6° over the measurement period (i.e. 20 ms in this case). If the proximity sensor monitor determines that the phase offset between the first and second $V_O$ measurements is greater than this limit, a fault condition is detected and reported. However, greater frequency offsets may be achievable, depending on a determined allowable error budget.

A disadvantage of this scheme is added latency, since it takes three measurement blocks ($V_O$, $V_S$, $V_O$) before a near/far determination can be made, rather than the two measurement blocks of the proximity sensor. In the preferred embodiments, a measurement block is approximately 10 ms, although there is no reason to limit to this value. It could be longer if desired. A consequence of this latency is that the proximity sensor monitor may, for a short period, report a different reading to that of the proximity sensor. If there is no actual fault, the proximity sensor and proximity sensor monitor signals should come into agreement after a small number of measurement blocks.

In a second embodiment of the frequency offset compensation, the processor switches the switch to measure $V_O$ and performs a Discrete Fourier Transform (DFT) on the first measured $V_O$. This DFT reveals the phase of the first $V_O$ measured at a first time. The switch then switches to measure $V_S$ and performs a DFT to reveal the phase of the $V_S$ measured at the second time. If there is a frequency offset between proximity sensor and proximity sensor monitor, the phase will have rotated between $V_O$ and $V_S$. The processor then uses the phases of the measured $V_O$ and a previously measured $V_O$ ($V_{O-1}$ for example) to perform an extrapolation to calculate a phase of a $V_O$ measurement if a $V_O$ measurement was taken at the second time (i.e. the same time as the $V_S$ measurement). This calculated phase can then be used to apply a phase offset to either of the $V_O$ measurements such that the calculations of impedance may be performed as described above with reference to FIG. 2.

In a first version of the extrapolation method, the $V_{O-1}$ and $V_O$ measurements are taken in from different measurement blocks (e.g. each from a 10 ms measurement block as in the preferred system).

In a second version of the extrapolation method, the $V_{O-1}$ and $V_O$ measurements are taken in from a single measurement block (i.e. each from the same 10 ms measurement block). Advantageously this means that there is less latency when compared to the first extrapolation method (since only two measurement blocks are required to perform the near/far determination). However, since half of the samples are used for each $V_O$ measurement, this decreases the Signal to Noise ratio of each $V_O$ measurement by 3 dB. However, in practice, this reduction in SNR could be greater, since there are transients associated with the switch disconnecting from one end of the impedance component and connecting to the other end of the impedance component. Either this transient period is ignored (for example by dumping the data from that period), or it is filtered to remove the transient signals.

Advantageously, either of the extrapolation methods enable the near/far determination to be performed after the $V_S$ measurement, which is the same position as the proximity sensor. As such, this is little to no latency when compared with the first (interpolation) method.

In a third embodiment of the frequency offset compensation, the proximity sensor monitor comprises a counter unit to receive and count the clock signal or excitation frequency signal from the proximity sensor. From this, the frequency can be monitored and compared to the frequency of the proximity sensor monitor clock or excitation frequency, and a phase offset per measurement block that can be determined. The processor uses the determined phase offset and applies this phase correction value to a measured $V_O$ such that is substantially aligns with the phase of the a $V_O$ signal if it were measured at the same time as the measured $V_S$. The calculations of impedance may now be performed as described above with reference to FIG. 2.

An advantage of using a counting unit is that no calculation of the phase offset is required (either by interpolation or extrapolation). However, a counting unit requires multiple samples of the clock to determine the frequency of the clock being monitored accurately. Many samples provides high accuracy, but at the cost of a high latency of the proximity sensor monitor (in that it needs to wait for all of the samples to be counted before performing the near/far calculation)—unless of course more powerful (and expensive) processors are used. On the other hand, taking fewer samples reduces the latency of the proximity sensor monitor, but at the cost of accuracy.

Figure 4:
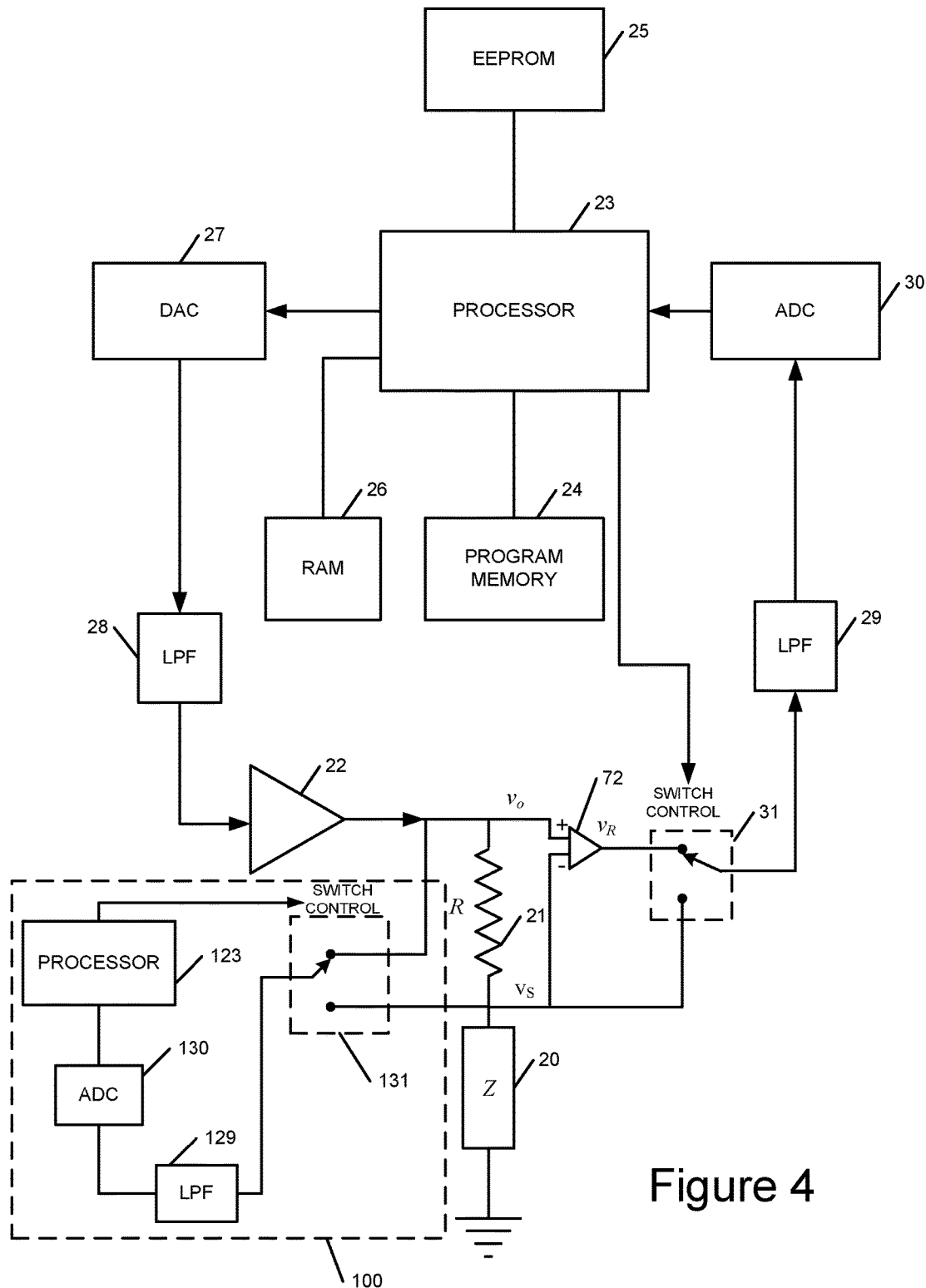
FIG. 4 is a schematic diagram of a second proximity measurement system incorporating a proximity sensor monitor according to the present invention.

A second version of the proximity sensor system is shown in FIG. 4. In this version, the proximity sensor system is similar to that of FIG. 3, (and hence like reference numerals have been used for like components) except that the measured voltages are $v_s$ and $v_R$ where $v_R$ is the difference between the voltages $v_o$ and $v_s$ as provided by an analogue difference amplifier 72. The proximity sensor monitor remains unchanged from FIG. 3.

In this version of the proximity sensor system, the processing, applied to the two consecutively measured input signals (or "block-pair"), will yield $$\frac{M\hat{V}_S}{2} \equiv \hat{A}_S \text{ and } \frac{M\hat{V}_R}{2} \equiv \hat{A}_R$$

where $\hat{V}_S$ and $\hat{V}_R$ are the complex voltage amplitude estimates measured by the system at the device 20 and at the output of the difference amplifier 72 respectively. Cross- and auto-power spectral estimators are then formed as in the first embodiment.

This version benefits from the avoidance of the need to calculate the difference voltage parameter $\hat{A}_R$ from $\hat{A}_S$ and $\hat{A}_o$. However a difference amplifier is required which is highly accurate and stable.

Figure 5:
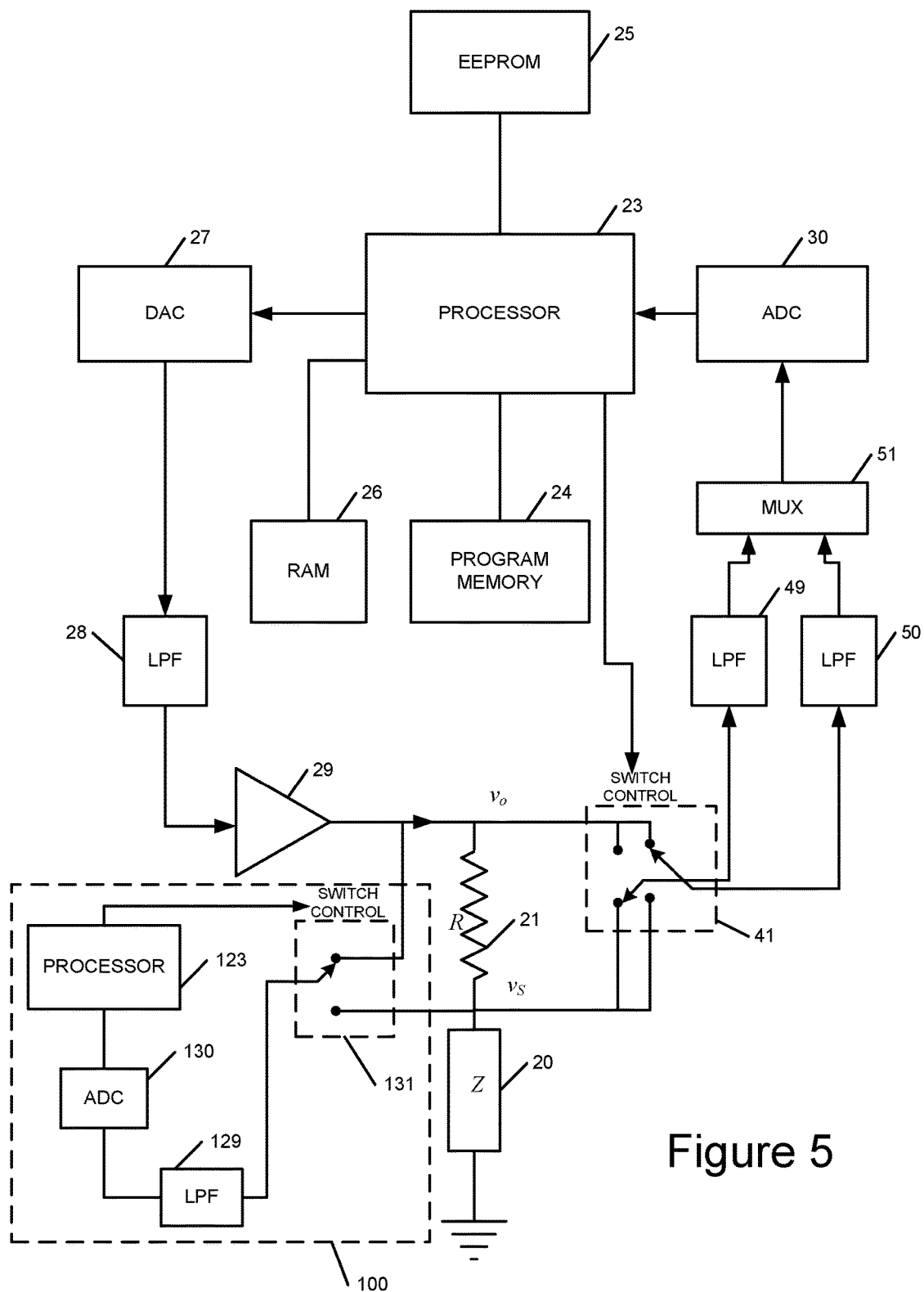
FIG. 5 is a schematic diagram of a third proximity measurement system incorporating a proximity sensor monitor according to the present invention.

A third version of the proximity sensor system will now be described with reference to FIG. 5. This version is similar to the first embodiment of the present invention illustrated in FIG. 3 and hence like reference numerals are used for like components. This version differs from that shown in FIG. 3 in that multiple measurement channels are provided for simultaneous measurement of the voltages sequentially. In this version there are two channels operating so that at any point in time a measurement of both voltages $v_o$ and $v_s$ is being taken simultaneously. Each measurement channel includes a low pass filter 49 or 50. In this version the measurement channels share an analogue-to-digital converter 30 by the use of a multiplexer 51 to multiplex the signals via the ADC into the processor 23.

In an alternative version each measurement channel could have its own analogue-to-digital converter. Also, although this version illustrates the use of two simultaneous measurement channels, there may be any number. The number is limited only by the number of samples in each block. At the limit, each of a plurality of 2M channels could provide simultaneous measurements sequentially starting at each sample point of the M samples per block so that the channels measure the voltages one cyclically sample point out of phase.

Each measurement channel provides sequential measurements of the voltages. Each channel allows the processor to generate a result every second block after an initial delay of two blocks. In the version illustrated in FIG. 5 the use of two channels enables the processor to produce a result every block. In the extreme, where there are 2M channels, the processor could produce a result every sample point.

In the case of two channels, during samples 0 to M−1 channel 1 will be switched to sample $v_o$ for example and during samples M and 2M−1, it will be switched to measuring $v_s$ and so on alternately. Whereas, channel 2 will be switched to measure $v_o$ during samples M to 2M−1, and during samples 2M to 3M−1 it will be switched to measure $v_s$, and so on alternately. By computing results for consecutive block-pairs, this enables results to be available from channel 1 at times (2M−1)τ, (4M−1)τ etc, whereas results are available from channel 2 at interleaved times (3M−1)τ, (5M−1)τ etc. This can be extended to more channels in the same manner.

In the limiting case of 2M measurement channels, each pair of channels begins its acquisition of its block-pairs one sample delayed from the previous pair of channels. One of the pair will begin by measuring a block of $v_o$, and the other will measure $v_s$. This enables, after an initial delay of one block-pair, results taken across all of the channels to be available every sample point.

Evenly spaced results (in time) are generated for multiple channels if the number of channels is 2 times a factor (or the product of factors) of M.

In this version, in order to improve the accuracy of the processed result, the processor can perform an averaging operation on the measurements from the multiple channels. The averaging can be of the parameters $\hat{A}_S$ and $\hat{A}_o$, or $\hat{A}_S$ and $\hat{A}_R$ for example.

These versions of the present invention are suited to use with proximity sensors. The design can use a separate microprocessor for each sensor. This is economically viable because the processor can be very simple and cheap. It also means that the system is highly modular, and failures in one sensor channel are unlikely to affect another sensor channel (because the channels are effectively self-contained). However, it is possible to combine more than one sensor channel with a single, more powerful, processor yet still use the sequential measurement technique and economical processing method to simplify the system and reduce its cost.

Since the designer can choose the excitation frequencies, it is possible to ensure that they are not close to other significant sources of interference (such as harmonics of an alternating current (ac) power line frequency).

Where crosstalk from one sensor system to another is unavoidable, it is preferable for each system to be operating at a different set of frequencies. This may not be possible, however, as there is an incentive to make all systems the same. In this case, the frequencies of each system can be made to change in such a way that one system's excitation will be uncorrelated from another's (a random variation of the excitation frequencies from block-pair to block-pair within some bounded range would achieve this, for example). Alternatively, the frequencies can be kept fixed and the phases of the excitation blocks can be changed from block-pair to block-pair.

Where interfering noise is thought to be a problem, the number of samples in each data block, M, can be increased. This is at the cost of a slower response to changes in the sensor-target separation. M could be adaptively varied in response to some estimate of the level of background noise. An alternative (or complement) to varying M is to form the cross- and auto-power spectral estimates from the averages of more than one set of consecutive data block-pairs. This has the same effect of improving the noise immunity at the cost of a slower response to sensor-target separation. The number of averages chosen could be adaptively varied in response to some estimate of the level of background noise. A useful estimate of the background noise could be derived from the coherence, $\gamma_{RS}^2$ given by $$\gamma_{RS}^2 = \frac{|\overline{\hat{S}_{RS}}|^2}{\overline{\hat{S}_{RR}}\,\overline{\hat{S}_{SS}}}$$

although in practice, $|\overline{\hat{S}_{RS}}|^2$ would be compared to $\overline{\hat{S}_{RR}}\,\overline{\hat{S}_{SS}}$ without performing the computationally expensive division. The averages (indicated by an over bar) are taken over more than one data block-pair. This would normally be performed as a "running average" over a chosen number of data block-pairs. The coherence will be close to unity if the noise is low, and tends to zero as the noise increases. The only additional quantity that has to be computed is $$\hat{S}_{SS} = \hat{A}_S \hat{A}_S^*.$$

An adaptive scheme might vary M and/or the number of averages of the cross- and auto-power spectral estimates in order to keep the coherence at around some threshold value, such as 0.95.

In the above method a modulus is required. An alternative method comprises using the equation:

$$\gamma_{RS}^2 = \frac{\overline{\hat{S}_{RS}}\,\overline{\hat{S}_{RS}^*}}{\overline{\hat{S}_{RR}}\,\overline{\hat{S}_{SS}}}.$$

This avoids the need for the modulus operation. The comparison to avoid division can then be carried out by determining if:

$$\gamma_{RS}^2 > \gamma_{threshold}^2.$$

i.e. whether $$\overline{\hat{S}_{RS}^*}\,\overline{\hat{S}_{RS}} > \gamma_{threshold}^2 \overline{\hat{S}_{RR}}\,\overline{\hat{S}_{SS}}.$$

In some systems, large, sudden and short duration noise is present (this would be typified by a lightning strike, for example). Where a running estimate of the coherence is being maintained, the consequent sudden drop in coherence can be used as an indicator that a false "near/far" indication may be given. It is then possible to e.g. hold the previous state until the coherence regains an acceptable level. This helps to avoid false indications during periods of strong intermittent noise.

An alternative approach to estimating the noise on the signals is to compare the total magnitude of the signal with its extracted complex amplitude. So, for example, one could compare $$\left(\sum_{0}^{M-1} v_n^2 - \sum_{1}^{K}\left|\frac{M\hat{V}_k}{2}\right|^2\right) \text{ to } \left|\frac{M\hat{V}_k}{2}\right|^2,$$

when the excitation contains K sinusoids at different frequencies, to decide if the signal at frequency $\omega_k$ is sufficiently large compared to all of the other (non-system related) noise on the signal. If it is not, and nor are any of the other excitation components, then one might choose to ignore the "near/far" indication given and hold a previous value. This type of comparison is prone to false alarms, however, because the process of extracting the complex amplitudes at the excitation frequencies is highly frequency-selective, so even large amounts of noise in the signal at other frequencies may have little effect on the accuracy of the "near/far" indication. It may, however, still be a useful technique for catastrophic events, such as a lightning strike. Again, a "running average" of the above comparison over more than one data block-pair could be maintained, and the trend in this average used to diagnose sudden increases in noise.

A "diagnostic" signal could be generated by the system for output to other systems when excessive noise interference is detected by either of the above general techniques.

The proximity sensor monitor is not limited to use with switched proximity sensors.

Figure 6:
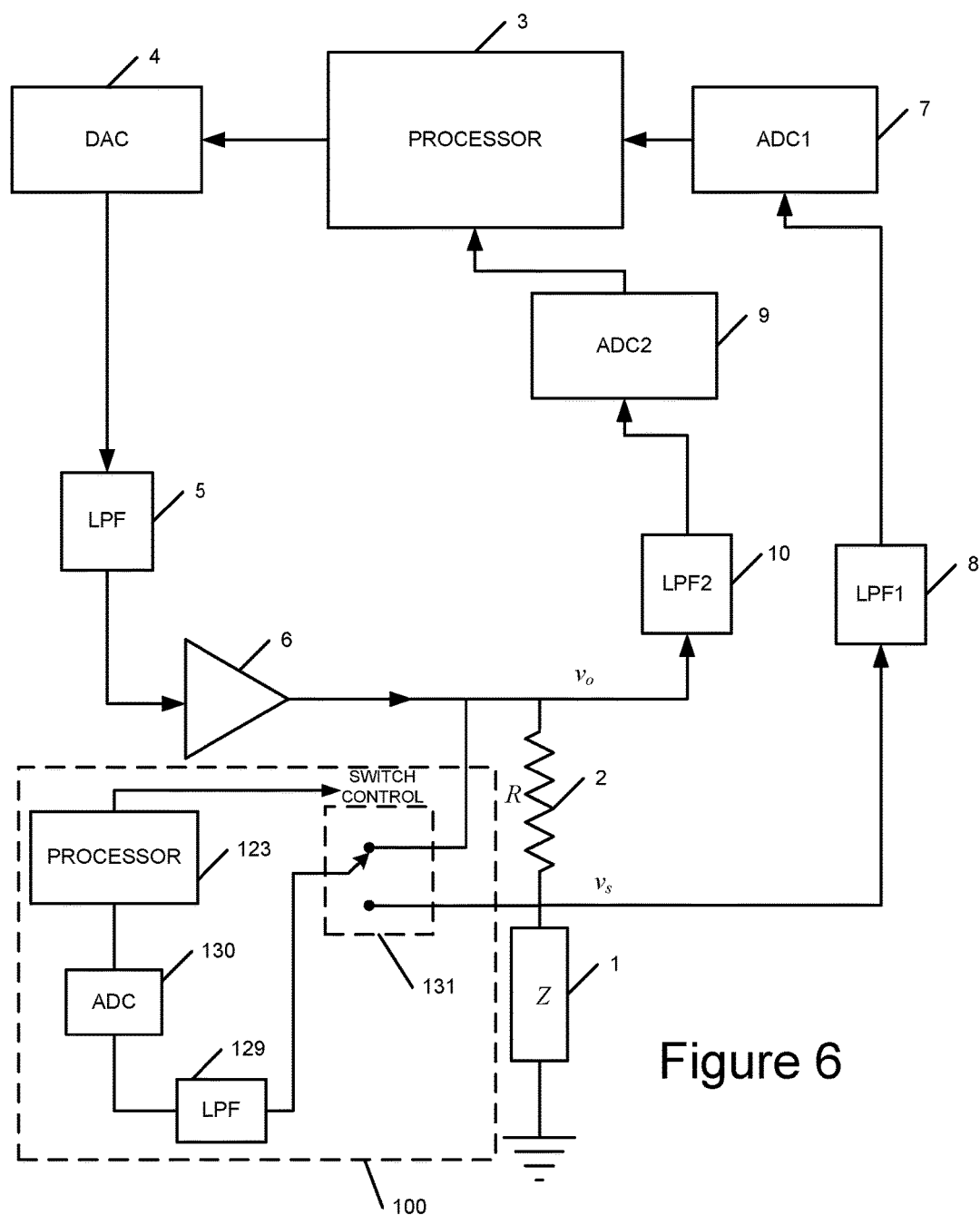
FIG. 6 is a schematic diagram of a fourth proximity measurement system incorporating a proximity sensor monitor according to the present invention.

A further version of a proximity sensor system is shown in FIG. 6, which is a proximity sensor according to FIG. 1, with the provision of the proximity sensor monitor 100. The operation of the proximity sensor and proximity sensor monitors are as described above. The RAM, EEPROM and Program Memory are not shown for clarity. As with the above examples, the first and second inputs of the proximity sensor monitor are coupled respectively to a first end of the impedance component R 2 of the proximity sensor, and a second end of the impedance component R 2.

Figure 7:
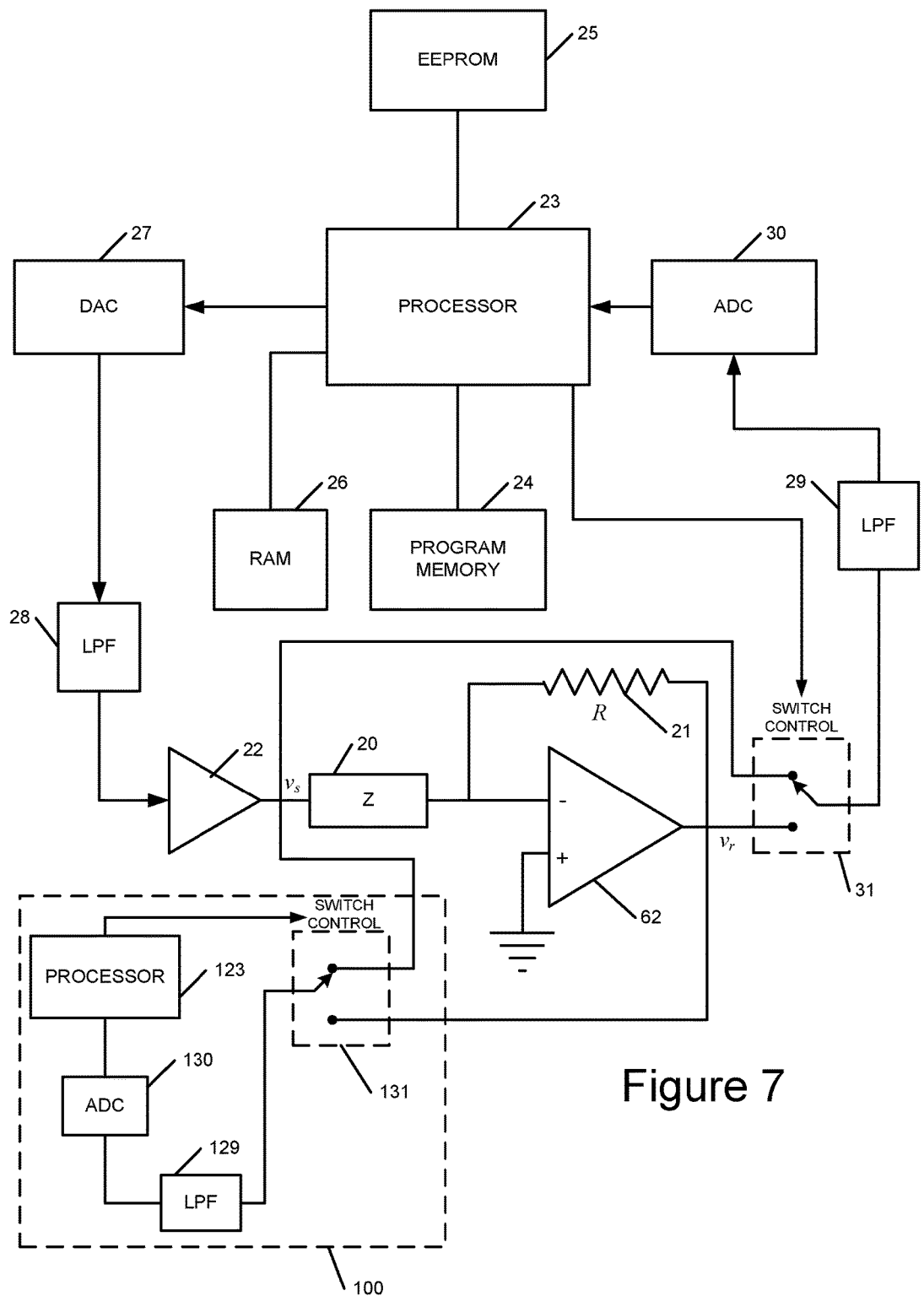
FIG. 7 is a schematic diagram of a fifth proximity measurement system incorporating a proximity sensor monitor according to the present invention.

A further version of a proximity sensor system incorporating a proximity sensor monitor is shown in FIG. 7.

A load resistance or impedance component 21 which is temperature and age stable and whose value is known and stored within the processing system has one end connected to the output of an operational amplifier 62, and the other end connected to the inverting input of the operational amplifier 62. The electrical component 20 has one end connected to the inverting input of the operational amplifier 62, and the other end connected to an amplifier 22, which generates a drive signal comprising at least one sinusoidal signal. The electrical component 20 may be the same electrical component as described with reference to FIGS. 1 to 6. The operational amplifier 62 has it's non-inverting input connected to ground, or in some embodiments it is coupled to a reference voltage. The operational amplifier 62 is configured as a voltage amplifier.

As with the other proximity sensor systems described above, a processor 23 is provided with a program memory 24 to control the operation of the processor. An erasable programmable read-only memory (EEPROM) 25 is provided to store data to be used by the processor 23. The data stored in the EEPROM 25 can include waveform generation data comprising a digital representation of at least a part of a waveform. Alternatively this can be stored in the program memory 24 or the random access memory (RAM) 26. The processor 23 is thus able to read the data from the EEPROM 25 in order to generate a continuous digital waveform which in this embodiment comprises a single wave form for simplifying explanation hereinafter. The storage of the waveform within the EEPROM 25 (or other memory location) makes the production of the digital drive waveform simple. A processor 23 is not required to perform calculations in order to determine output values for a cyclical waveform; instead values are simply repeatedly read out of the EEPROM 25.

A random access memory (RAM) 26 is provided to enable the processor 23 to store data during processing.

The digital drive signal output from the processor 23 is input to a digital-to-analogue converter 27 to generate an analogue wave signal which is passed through a low pass filter 28 and input to the amplifier 22 to generate the drive signal to the electrical component 21. The low pass 'reconstruction' filter 28 reduces undesirable artefacts of the digital-to-analogue conversion process. In an alternative embodiment the DAC 27 can be replaced with a pulse width modulated digital output directly from the processor 23.

The resistance value of the impedance component 21 can be stored in the EEPROM 25, the program memory 24 or the RAM 26 for use in data processing. In fact to avoid the requirement for a division in the computation, the reciprocal of the resistance value may be stored so that a multiplication operation can be used in the calculation instead.

The processor 23, the DAC 27, the ADC 30, the EEPROM 25, the RAM 26 and the memory 24 can all be provided on a microcontroller such as the Microchip PIC series. Thus the microcontroller can perform the function of signal generation and signal processing.

A single measurement channel is provided comprised of a low pass filter 29 and an analogue-to-digital converter 30 to provide a digitised input to the processor 23. The measurement channel is connected to a switch arrangement 31, which receives as inputs connections from the output of the amplifier 22 and the output of the operational amplifier 62. The switch arrangement is controlled by a control signal from the processor 23 to switch between measurements of the voltages $v_s$ (the output of the amplifier 22 i.e. the drive signal) and $v_r$ (the output of the operational amplifier 62).

The proximity sensor monitor 100 has a switch 131 coupled to first and second inputs of the proximity sensor monitor. In this version, the first and second inputs are coupled respectively to the output of the amplifier 22 (also the first end of the electrical component) and the output of the operational amplifier 62 (also the first end of the impedance component). The proximity sensor monitor switch is controlled by a control signal from the processor 123 to switch between measurements of the voltages $v_s$ (the output of the amplifier 22 i.e. the drive signal) and $v_r$ (the output of the operational amplifier 62). The single measurement channel is provided comprised of a low pass filter 129 and an analogue-to-digital converter 130 to provide a digitised input to the processor 123. The operation of the proximity monitor sensor is as described with reference to FIGS. 3 to 6.

The processor 23 controls the generation of the sinusoidal output signal to be in synchronism with the measurements input from the analogue-to-digital converter. Thus the waveforms are generated and measured synchronously. The processor 23 can comprise a microcontroller to control the output as well as the acquisition of the input samples. The output sequence comprises a block of samples during which the switch 31 is controlled so that the measurement channel measures the voltage $v_s$ (the output of the amplifier 22 i.e. the drive signal) during one measurement period. The block of samples may contain any multiple of cycles of a periodic waveform, such as a single sinusoid. The processor 23 then controls the switch 31 to switch to receive measurements of the voltage $v_r$ (the output of the operational amplifier 62) and during this measurement period the processor 23 outputs a sequence identical to the previous sequence. Thus during pairs of measurement periods the output sequences are identical. It is thus preferable for the successive measurements to occur over successive blocks. The blocks need not be consecutive. It is possible for there to be a quiescent period between measurements, or the blocks can be filled with an initial number of zeros. However, to avoid latency it is preferred that measurements are taken successively and each measurement period comprises a whole block of data. In order to compensate for any transient factors, it is possible for the first part of the responses to the output to be discarded or not measured to allow for settlement. It is preferred that the measurements be taken during the same section of successive blocks to avoid for the need for any phase compensation. However, the system is able to compensate for different phase measurements if required. The blocks themselves may be different from one pair of measurements to the next.

Thus measurements are provided to the processor in successive blocks of the voltage $v_s$ on one side of the electrical component 20 which comprises the voltage applied across the electrical component 20 (in the situation where the reference voltage connected to the non-inverting input of the operational amplifier 62 is zero, since the non-inverting input is considered to be a virtual ground point). The other voltage measurement obtained is the voltage $v_r$, which is the output of the operational amplifier (and also the voltage across the impedance component 21, since the input of the operational amplifier is a virtual ground when the non-inverting input is zero).

In FIG. 7 the impedance component 21 is provided to enable the determination of the current flowing through the electrical component 20. From this, the impedance of the electrical component can be determined. The complex amplitude of the current can be calculated using Ohm's law as follows:

$$I = \frac{V_s}{Z}$$

where $V_s$ is the complex amplitude at some frequency of $v_s$. applied to the electrical component by the amplifier 22.

However, assuming that the amplifier 62 has a sufficiently high input impedance, all of the current flowing through the electrical component 20 into the node at the non-inverting input of amplifier 62 flows out through the impedance component 21, i.e. (by Kirchoff's current law):

$$I = -\frac{V_r}{R}$$

Therefore:

$$I = \frac{V_s}{Z} = -\frac{V_r}{R}$$

Solving for Z, which is the impedance we are trying to determine:

$$Z = -\frac{V_s R}{V_r}$$

It can be seen from this equation that impedance can be calculated from the ratio of the two complex voltage amplitudes taking into consideration the resistance of the impedance component 21.

As with above versions of the proximity sensor system, the sequential measurements can be used to calculate the impedance. To detect a change of impedance, or in the case of the device being a proximity sensor, to detect the proximity of a target, the impedance value can be compared with a threshold impedance value to determine the proximity of a target to the sensor.

Such versions that involve the calculation of the impedance, however, require for a computationally expensive division operation to be carried out. Such divisions, also can result in out of range results e.g. a divide by zero operation which can be caused by noise.

A preferred version does not result in the calculation of an absolute value for impedance. Instead quantities derived from the $V_s$ and the $V_r$ are compared to identify a change in the relative values. This can be used to compare the relative values with a threshold.

Similarly with the other described proximity sensor systems, the output of the proximity sensor may be an impedance value or a near/far determination.

Figure 8:
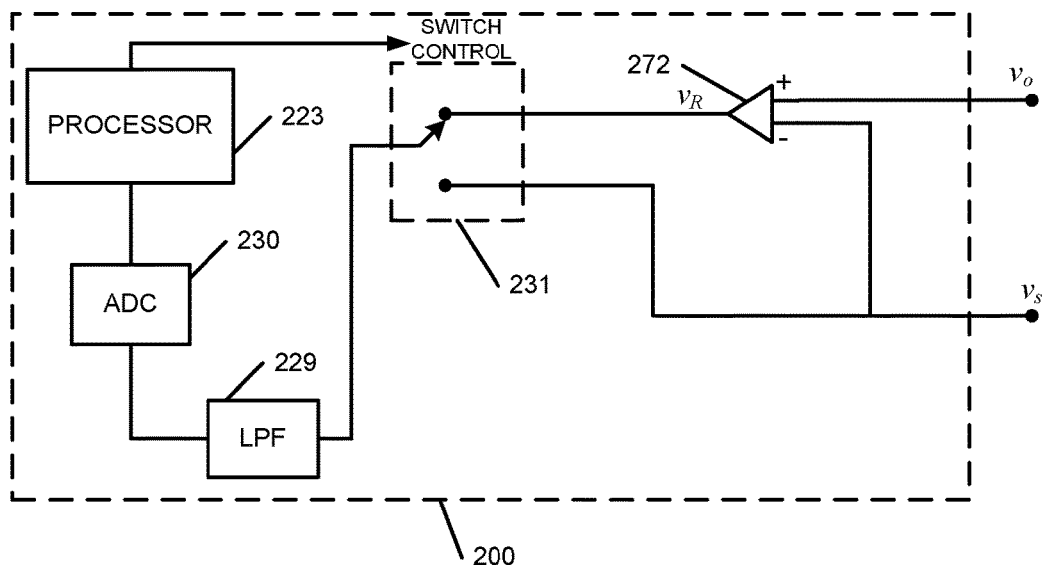
FIG. 8 is a schematic of a second embodiment of the proximity sensor monitor.

A second embodiment of the proximity sensor monitor 200 is shown in FIG. 8, which incorporates a difference amplifier 272 to provide the difference voltage $V_R$ to one of the switch 231 inputs. In this embodiment, the difference amplifier is coupled between the first input of the proximity sensor and one of the switch inputs. The second input of the switch 231 is connected to the second input of the proximity sensor monitor. As with the above proximity sensor systems described with reference to FIGS. 3 to 7, the first input of the proximity monitor may be coupled to the first side of the impedance component 21 (FIGS. 3 to 6) or first side of the electrical component (FIG. 7). The second input of the proximity sensor monitor may be coupled to the second side of the impedance component 21 (FIGS. 3 to 6) or the first side of the impedance component (FIG. 7). The operation of the proximity sensor monitor switch 231 and processor 223 with regards to the switching, measurement and calculation of the parameters is similar to that of the proximity sensor of FIG. 4, with the addition of the frequency offset compensation as in the proximity sensor monitor of FIG. 4.

Figure 9:
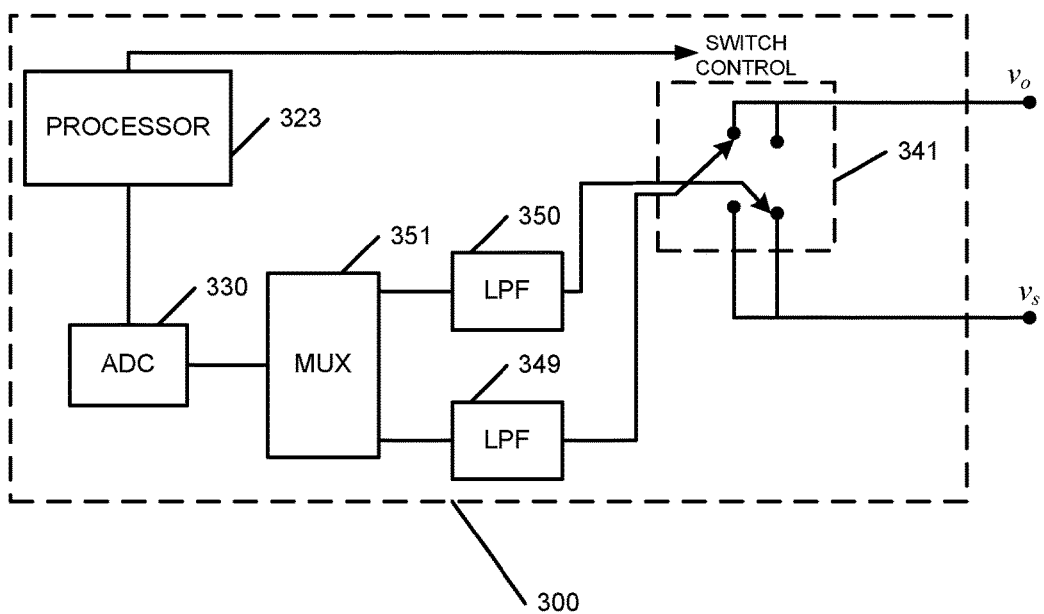
FIG. 9 is a schematic of a third embodiment of the proximity sensor monitor.

A third embodiment of the proximity sensor monitor 300 is shown in FIG. 9, which incorporates a switch 341 connected to multiple measurement channels, which are provided for simultaneous measurement of the voltages sequentially. In this embodiment there are two channels operating so that at any point in time a measurement of both voltage signals at the first and second inputs of the proximity sensor monitor (for example $v_o$ and $v_s$ in FIGS. 3 to 6, or $v_s$ and $v_r$ in FIG. 7) is being taken simultaneously. Each measurement channel includes a low pass filter 349 or 350. In this embodiment, the measurement channels share an analogue-to-digital converter 330 by the use of a multiplexer 351 to multiplex the signals via the ADC into the processor 323. The operation of the proximity sensor monitor switch 341 and processor 323 with regards to the switching, measurement and calculation of the parameters is similar to that of the proximity sensor of FIG. 5, with the addition of the frequency offset compensation as in the proximity sensor monitor of FIG. 5.

There is no necessity for the electrical component or the impedance component to be purely resistive, provided the impedance of the electrical component is known, and the impedance of the impedance component is stable.

The value for R (or the reciprocal of R or a derived quantity) is stored in the processor memory e.g. the EEPROM of FIGS. 3 to 7 for use in the calculation of the impedance or at least one component of impedance of the device using prior art processing techniques, or for use in the calculation of the comparison as described hereinabove.

In any embodiment of the present invention described hereinabove, the processor can be programmed to identify a fault in the device i.e. to carry out diagnostics for the device. For example, if the processor detects that the voltage $v_o$ is below a threshold, this may indicate that the digital-to-analogue converter is damaged. If the voltage $v_s$ is below a threshold, this indicates that the device has gone short circuit. If $v_o \approx v_s$ this indicates that the device has gone open circuit. The processor can detect these types of faults and can generate an output that can be used to give a warning. This technique is equally applicable to prior art systems.

Although embodiments of the present invention have been described with reference to inductive devices, the present invention also applied to capacitance devices since the imaginary part of impedance (the reactive part) is dependent upon inductance or the inverse of capacitance. Such variable capacitive devices, such as variable capacitance proximity sensors are well known in the art.

Although the present invention has been described with reference to specific embodiments, it will be apparent to a skilled person in the art that modifications lie within the scope of the claims.

The invention claimed is:

1. A proximity sensor monitor for sensing the proximity of a target and for coupling to a proximity sensor for sensing the proximity of the same target, the proximity sensor comprising: an electrical component having electrical properties that vary with the proximity of the target; an impedance component connected to the electrical component and having a known impedance; and a signal generator for generating an electrical signal for application to the connected electrical and impedance components, the proximity sensor signal generator being driven by a proximity sensor excitation frequency, the electrical and impedance components being arranged to provide first and second analogue voltage signals in response to the electrical signal from the signal generator; the proximity sensor monitor comprising:

a first and second input for receiving, respectively, the first and second analogue voltage signals from the proximity sensor;

a switch having first and second inputs coupled respectively to the first and second inputs of the proximity sensor monitor, and having an output, the switch being configured to switch between the first and second inputs of the proximity sensor monitor;

an analogue-to-digital converter coupled to the output of the switch for receiving an analogue voltage signal and for generating a digital voltage signal; and a processor connected to the analogue-to-digital converter for receiving the digital voltage signal and for generating a proximity monitor signal, the processor being driven by a proximity sensor monitor excitation frequency, wherein the processor is configured to control the switch to connect to the first and second inputs sequentially to measure the first analogue voltage signal and the second analogue voltage signal respectively, and wherein the processor is configured to compensate for a frequency difference between the proximity sensor monitor excitation frequency used to generate the proximity monitor signal, and the proximity sensor excitation frequency used to generate the electrical signal applied to the connected electrical and impedance components by the signal generator of the proximity sensor, in order to generate the proximity monitor signal, the proximity sensor monitor processor compensating for the frequency difference by:

determining a phase correction value, and applying the phase correction value to a measured voltage.

2. A proximity sensor monitor according to claim 1, wherein the proximity sensor monitor processor is configured to generate the proximity monitor signal as a measure of impedance, or at least one component of the impedance, of the electrical component.

3. A proximity sensor monitor according to claim 1, wherein the proximity sensor monitor processor is configured to generate the proximity monitor signal as an indication of whether or not a factor related to the impedance or at least one component thereof is above or below a threshold.

4. A proximity sensor monitor according to claim 1, wherein the proximity sensor monitor processor is configured to compensate for the frequency difference by:

determining a first parameter indicative of a phase of the complex amplitude of a first measured voltage measured at a first time;

determining a second parameter indicative of a phase of the complex amplitude of a second measured voltage measured at a second time;

determining a third parameter indicative of a phase of the complex amplitude of a third measured voltage measured at a third time;

determining a phase correction value dependant on the first and third parameters;

applying the phase correction value to the first or third measured voltages in order to generate a fourth voltage, the fourth voltage representing a first or third voltage at the second time.

5. A proximity sensor monitor according to claim 4, wherein:

the first and third measured voltages are voltages measured at the first input of the switch; and the second measured voltage is a voltage measured at the second input of the switch.

6. A proximity sensor monitor according to claim 4, wherein:

the first and third measured voltages are voltages measured at the second input of the switch; and the second measured voltage is a voltage measured at the first input of the switch.

7. A proximity sensor monitor according to claim 4, wherein the proximity sensor monitor processor is configured to determine a phase correction value by using linear or polar interpolation using the first and third parameters.

8. A proximity sensor monitor according to claim 4, wherein the processor is configured to:

determine a first parameter indicative of the complex amplitude of a voltage across the electrical component, and a second parameter indicative of the complex amplitude of the difference between the voltage across the electrical component and the fourth voltage or the voltage difference;

multiply each of the first and second determined parameters by the complex conjugate of the second determined parameter to generate third and fourth parameters respectively; and compare the third and fourth parameters to generate the proximity monitor signal, or compare one or more components or derivatives of the third parameter and one or more components or derivatives of the fourth parameter to generate the proximity monitor signal.

9. A proximity sensor monitor according to claim 8, wherein the processor is configured to include an averaging process in the generation of the third and fourth parameters.

10. A proximity sensor monitor according to claim 8, wherein the processor is configured to multiply the voltage across the electrical component by a factor based on a complex conjugate signal of which the generated signal generated by the signal generator is a part to determine the first parameter, to multiply the fourth voltage by the factor to determine an interim parameter, and to subtract the first parameter from the interim parameter to determine the second parameter.

11. A proximity sensor monitor according to claim 8, wherein the processor is configured to multiply the voltage across the electrical component by a factor based on a complex conjugate signal of which the generated signal is a part to determine the first parameter, to determine a difference voltage using the voltage across the electrical component and the fourth voltage, and to multiply the difference voltage by the factor to determine the second parameter.

12. A proximity sensor monitor according to claim 8, wherein the processor is configured to multiply the voltage across the electrical component by a factor based on a complex conjugate signal of which the generated electrical signal is a part to determine the first parameter, and to multiply the voltage difference measurement by the factor to determine the second parameter.

13. A proximity sensor monitor according to claim 8, wherein the processor is configured to multiply each digital voltage measurement by a factor based on a complex conjugate signal of which the generated electrical signal is a part to determaine the first parameter and to sum each of the digital voltage measurements multiplied by the factor over a plurality of digital samples.

14. A proximity sensor monitor according to claim 8, wherein the processor is configured to compare the third and fourth parameters using a constant, wherein the constant is dependent upon an impedance or at least one component of impedance of the impedance component.

15. A proximity sensor monitor according to claim 14, wherein the processor is configured to compare the third and fourth parameters to generate the output by comparing the result of multiplying each fourth parameter by the constant with each third parameter; wherein the constant includes the reciprocal of the impedance or part thereof of the impedance component.

16. A proximity sensor monitor according to claim 8, wherein the processor is configured to determine an estimate of noise in the measurements using averages of the third and fourth parameters over a plurality of measurements, and to ignore the current comparison of the third and fourth parameters if the noise is above a threshold.

17. A proximity sensor monitor according to claim 1, wherein the proximity sensor monitor processor is configured to compensate for the frequency difference by:
determining a first parameter indicative of a phase of the complex amplitude of a first measured voltage measured at a first time;
determining a second parameter indicative of a phase of the complex amplitude of a second measured voltage measured at a second time;
determining a third parameter indicative of a phase of the complex amplitude of a third measured voltage measured at a third time;
determining a phase correction value dependant on the first and second parameters;
applying the phase correction value to the first or second measured second voltage in order to generate a fourth voltage, the fourth voltage representing a first or second voltage at the third time.

18. A proximity sensor monitor according to claim 17, wherein:
the first and second measured voltages are voltages measured at the first input of the switch; and
the third measured voltage is a voltage measured at the second input of the switch.

19. A proximity sensor monitor according to claim 17, wherein:
the first and second measured voltages are voltages measured at the second input of the switch; and
the third measured voltage is a voltage measured at the first input.

20. A proximity sensor monitor according to claim 17, wherein the processor is configured to determine a phase correction value by extrapolation using the first and second parameters.

21. A proximity sensor monitor according to claim 17, wherein the first and second measured voltages are measured in consecutive switching cycles.

22. A proximity sensor monitor according to claim 17, wherein the first and second measured voltages are measured during first and second portions of a single switching cycle.

23. A proximity sensor monitor according to claim 1, comprising a counter unit to receive the proximity sensor excitation signal from the proximity sensor used by the signal generator of the proximity sensor to generate the electrical, and wherein the proximity sensor monitor processor is configured to determine a phase correction value from a difference in the frequency of the proximity sensor excitation frequency, and the proximity sensor monitor excitation frequency used to generate the proximity monitor signal.

24. A proximity sensor monitor according to claim 23, wherein the processor is configured to compensate for the frequency difference by:
determining a first parameter indicative of a phase of the complex amplitude of a first measured voltage measured at a first time;
determining a second parameter indicative of a phase of the complex amplitude of a second measured voltage measured at a second time;
applying the phase correction value to the first measured voltage in order to generate a fourth voltage, the fourth voltage representing a first voltage at the second time.

25. A proximity sensor monitor according to claim 24, wherein:
the first measured voltage is a voltage measured at the first input of the switch; and
the second measured voltage is a voltage measured at the second input of the switch.

26. A proximity sensor monitor according to claim 24, wherein:
the first measured voltage is a voltage measured at the second input of the switch; and
the second measured voltage is a voltage measured at the first input of the switch.

27. A proximity sensor monitor according to claim 1, wherein the switch comprises two outputs and wherein the switch is configured such that when one output is connected to the first end of the impedance component corresponding to a first voltage, the other output is connected to the second end of the impedance component corresponding to a second voltage, and wherein the processor is configured to measure the first and second voltages for each of the switch outputs.

28. A proximity sensor monitor according to claim 27, comprising a multiplexor having first and second inputs coupled to respective first and second outputs of the switch, and an output coupled to the analogue-to-digital converter.

29. A proximity sensor monitor according to claim 1, further comprising a comparison unit having an input for receiving the proximity signal, and an input for receiving the proximity monitor signal, the comparison unit being configured to compare the proximity signal and proximity monitor signal to detect a fault condition in which the difference between the signals is greater than a threshold, and configured to output a warning if a fault condition is detected.

30. A proximity sensor monitor according to claim 1, comprising a difference amplifier coupled between the first input and one input of the switch, the difference amplifier being configured to output an analogue difference voltage to the switch, the analogue difference voltage representing a difference voltage between the first analogue voltage signal and the second analogue voltage signal.

31. A proximity sensor monitor according to claim 1, wherein the impedance component of the proximity sensor is connected in series to the electrical component of the proximity sensor, the impedance component having a first end connected to a first end of the electrical component and a second end connected to the signal generator of the proximity sensor, wherein the first input is coupleable to the first end of the impedance component and the second input is coupleable to the second end of the second end of the impedance component, and wherein the first analogue voltage signal is an analogue voltage signal at the first end of the impedance component, and the second analogue voltage signal is an analogue voltage signal at the second end of the impedance component.

32. A proximity sensor monitor according to claim 1, wherein the electrical component of the proximity sensor has a first end and a second end, the impedance component of the proximity sensor has a first end and a second end, the second end of the impedance component being connected to the second end of the electrical component, the signal generator of the proximity sensor being connected to the first end of the electrical component, wherein the proximity sensor comprises an operational amplifier having an inverting input, a non-inverting input and an output, wherein the second ends of the electrical and impedance components are connected to the inverting input of the operational amplifier, and the first end of the impedance component is connected to the output of the operational amplifier, wherein the first input is coupleable to first end of the electrical component and the second input is coupleable to the first end of the impedance component, and wherein the first analogue voltage signal is an analogue voltage signal at the first end of the electrical component, and the second analogue voltage signal is an analogue voltage signal at the first end of the impedance component.

33. A proximity sensor system for sensing the proximity of a target comprising:

an electrical component for sensing the proximity of a target, the electrical component having electrical properties that vary with the proximity of the target;

an impedance component having a known impedance and a first end connected to a first end of the electrical component;

a switch connected to switch between the first end of the impedance component and a second end of the impedance component;

a signal generator connected to the second end of the impedance component for generating an electrical signal for application to the series connected impedance component and electrical component, the signal generator being driven by a proximity sensor excitation frequency;

an analogue-to-digital converter coupled to the switch for receiving an analogue signal and for generating a digital voltage signal;

a processor connected to the analogue-to-digital converter for receiving the digital voltage signal and for generating a proximity signal; and a proximity sensor monitor according to claim 1, the proximity sensor monitor first and second inputs being coupled respectively to the first end of the impedance component and the second end of the impedance component;

wherein the proximity sensor switch is coupled to switch between the first end of the impedance component and the second end of the impedance component, and wherein the processor is adapted to control the proximity sensor switch to switch to connect to the first and second ends of the impedance component sequentially.

34. A proximity sensor system according to claim 33, wherein the signal generator is adapted to generate the signal comprising sequential signal blocks for application to the connected electrical component and impedance component, wherein the proximity sensor switch is configured to switch a measurement channel comprising the analogue-to-digital converter to measure each of a first voltage and second voltage at respective first and second ends of the impedance component during the same part of the signal block of sequential signal blocks of the signal.

35. A proximity sensor system according to claim 34, wherein the signal generator includes a digital store storing a signal pattern for at least a part of a signal block, generator means for generating a digital signal by repeatedly using the stored signal pattern, and a digital-to-analogue converter for converting the digital signal to the signal.

36. A proximity sensor system according to claim 35, wherein the signal generator and the processor are adapted to operate synchronously.

37. A proximity sensor system according to claim 33, including a plurality of measurement channels for measuring the voltages, wherein the switch is adapted to switch each of the measurement channels to sequentially measure the voltages to allow simultaneous measurements in the measurement channels, and the processor is configured to process the sequentially measured voltages for each channel.

38. A proximity sensor system according to claim 37, wherein the processor comprises a digital processing arrangement, and the measurement channels include a common multiplexer arrangement and a common analogue-to-digital converter.

39. A proximity sensor system according to claim 33, wherein the processor is adapted to generate the output as a measure of impedance, or at least one component of the impedance, of the impedance component.

40. A proximity sensor system according to claim 33, wherein the processor is configured to generate the output as an indication of whether or not a factor related to the impedance or at least one component thereof is above or below a threshold.

41. A proximity sensor system according to claim 40, wherein the processor is configured to:

determine a first parameter indicative of the complex amplitude of a first voltage on a first side of the impedance component connected to the electrical component, and a second parameter indicative of the complex amplitude of the difference between the first and second voltages or the voltage difference;

multiply each of the first and second determined parameters by the complex conjugate of the second determined parameter to generate third and fourth parameters respectively; and compare the third and fourth parameters to generate the output, or compare one or more components or derivatives of the third parameter and one or more components or derivatives of the fourth parameter to generate the output.

42. A proximity sensor system according to claim 41, wherein the processor is configured to include an averaging process in the generation of the third and fourth parameters.

43. A proximity sensor system according to claim 41, wherein the processor is adapted to multiply the first voltage measurement by a factor based on a complex conjugate signal of which the generated signal is a part to determine the first parameter, to multiply the second voltage measurement by the factor to determine an interim parameter, and to subtract the first parameter from the interim parameter to determine the second parameter.

44. A proximity sensor system according to claim 43, wherein the processor is configured to multiply each voltage measurement by the factor and to sum each of the digital voltage measurements multiplied by the factor over a plurality of digital samples.

45. A proximity sensor system according to claim 41, wherein the processor is configured to multiply the first voltage measurement by a factor based on a complex conjugate signal of which the generated signal is a part to determine the first parameter, to detemiine a difference voltage using the first and second voltage measurements, and to multiply the difference voltage by the factor to determine the second parameter.

46. A proximity sensor system according to claim 41, wherein the processor is configured to multiply the first voltage measurement by a factor based on a complex conjugate signal of which the generated electrical signal is a part to determine the first parameter, and to multiply the voltage difference measurement by the factor to determine the second parameter.

47. A proximity sensor system according to claim 41, wherein the processor is configured to compare the third and fourth parameters using a constant, wherein the constant is dependent upon an impedance or at least one component of impedance of the impedance component.

48. A proximity sensor system according to claim 47, wherein the processor is configured to compare the third and fourth parameters to generate the output by comparing the result of multiplying each the fourth parameter by the constant with each the third parameter;
wherein the constant includes the reciprocal of the impedance or part thereof of the impedance component.

49. A proximity sensor system according to claim 41, wherein the processor is adapted to determine an estimate of noise in the measurements using averages of the third and fourth parameters over a plurality of measurements, and to ignore the current comparison of the third and fourth parameters if the noise is above a threshold.

50. A proximity sensor system according to claims 40, wherein the signal generator is configured to generate the electrical signal comprising a plurality of frequency components and the processor is configured to determine a first parameter indicative of the complex amplitude of the first voltage on the first side of the impedance component for each the frequency, and a second parameter indicative of the complex amplitude of the difference between the first and second voltages or the voltage difference for each the frequency, to multiply each of the first and second determined parameters by the complex conjugate of the second determined parameter to generate third and fourth parameters respectively, and to compare the third and fourth parameters to generate the output, or compare one or more components or derivatives of the third and fourth parameters to generate the output.

51. A proximity sensor system according to claim 33, wherein the processor is configured to monitor the output to detect fault conditions in the impedance component and to output a warning output if a fault condition is detected.

52. A proximity sensor system according to claim 51, wherein the processor is configured to detect a fault condition when an output is outside a threshold or range.

53. A proximity sensor system according to claim 33, further comprising a comparison unit having an input for receiving the proximity signal and an input for receiving the proximity monitor signal, the comparison unit being configured to compare the proximity signal and proximity monitor signal to determine a fault condition in which the difference between the signals is greater than a threshold, and configured to output a warning output if a fault condition is detected.

54. A proximity sensor system according to claim 33, wherein the electrical component comprises an inductor or a capacitor.

55. A proximity sensor system according to claim 33, wherein the impedance component comprises a resistor or an inductor.

56. A proximity sensor system for sensing the proximity of a target comprising:
an electrical component for sensing the proximity of a target, the electrical component having electrical properties that vary with the proximity of the target;
an impedance component having a known impedance and a first end connected to a first end of the electrical component;
a signal generator connected to the second end of the impedance component for generating an electrical signal for application to the connected impedance component and electrical component, the signal generator being driven by a proximity sensor excitation frequency;
a first analogue-to-digital converter coupled to the first end of the impedance component for receiving an analogue signal and for generating a first digital voltage signal;
a second analogue-to-digital converter coupled to the second end of the impedance component for receiving an analogue signal and for generating a second digital voltage signal;
a processor connected to the first and second analogue-to-digital converters for receiving the first and second digital voltage signals and for generating a proximity signal; and
a proximity sensor monitor according to claim 1, the proximity sensor monitor first and second inputs being coupled respectively to the first end of the impedance component and the second end of the impedance component.

57. A proximity sensor system for sensing the proximity of a target comprising:
an electrical component for sensing the proximity of a target, the electrical component having a first end and a second end and having electrical properties that vary with the proximity of the target;
an impedance component having a known impedance and a first end and a second end, the second end being connected to the second end of the electrical component;
a signal generator connected to the first end of the electrical component for generating an electrical signal for application to the electrical component, the signal generator being driven by a proximity sensor excitation frequency;
an operational amplifier having an inverting input, a non-inverting input and an output, wherein the second ends of the electrical and impedance components are connected to the inverting input of the operational amplifier, and the first end of the impedance component is connected to the output of the operational amplifier;
a switch connected to switch between the first end of the electrical component and the output of the operational amplifier;
an analogue-to-digital converter coupled to the switch for receiving an analogue signal and for generating a digital voltage signal;
a processor connected to the analogue-to-digital converter for receiving the digital voltage signal and for generating a proximity signal; and
a proximity sensor monitor according to claim 1, the proximity monitor first and second inputs being coupled respectively to the first end of the electrical component and the output of the operational amplifier;
wherein the proximity sensor switch is coupled to switch between the first end of the electrical component and the output of the operational amplifier, and
wherein the processor is adapted to control the proximity sensor switch to switch to connect to the first end of the electrical component and the output of the operational amplifier sequentially.

* * * * *